(12) United States Patent
Pedersen et al.

(10) Patent No.: US 7,202,677 B2
(45) Date of Patent: Apr. 10, 2007

(54) SOCKET FOR MATING WITH ELECTRONIC COMPONENT, PARTICULARLY SEMICONDUCTOR DEVICE WITH SPRING PACKAGING, FOR FIXTURING, TESTING, BURNING-IN OR OPERATING SUCH A COMPONENT

(75) Inventors: David V. Pedersen, Scotts Valley, CA (US); Benjamin N. Eldridge, Danville, CA (US); Igor Y. Khandros, Orinda, CA (US)

(73) Assignee: FormFactor, Inc., Livermore, CA (US)

( * ) Notice: Subject to any disclaimer, the term of this patent is extended or adjusted under 35 U.S.C. 154(b) by 96 days.

(21) Appl. No.: 10/749,028

(22) Filed: Dec. 30, 2003

(65) Prior Publication Data

US 2004/0152348 A1 Aug. 5, 2004

Related U.S. Application Data

(63) Continuation of application No. 09/205,502, filed on Dec. 4, 1998, now abandoned, and a continuation-in-part of application No. 09/108,163, filed on Jun. 30, 1998, now Pat. No. 6,033,935, which is a continuation-in-part of application No. 08/784,862, filed on Jan. 15, 1997, now Pat. No. 6,064,213, and a continuation-in-part of application No. 08/452,255, filed on May 26, 1995, now Pat. No. 6,336,269.

(51) Int. Cl.
  *G01R 31/02* (2006.01)
(52) U.S. Cl. ..................................... 324/754

(58) Field of Classification Search ............... 439/70, 439/73, 66, 71; 324/754; 257/697; 361/773, 361/774
See application file for complete search history.

(56) References Cited

U.S. PATENT DOCUMENTS

| | | | |
|---|---|---|---|
| 3,379,937 A | | 4/1968 | Shepherd |
| 3,939,381 A | * | 2/1976 | Meany ........................ 361/765 |
| 4,025,148 A | | 5/1977 | Bouley |
| 4,105,277 A | | 8/1978 | Jacobs |
| 4,477,134 A | | 10/1984 | Wright |

(Continued)

FOREIGN PATENT DOCUMENTS

EP 025210 3/1981

(Continued)

OTHER PUBLICATIONS

"Chip Column Package Structure," IBM Technical Disclosure Bulletin, vol. 40, No. 8, pp. 117-118 (Aug. 1997).

(Continued)

*Primary Examiner*—Neil Abrams
(74) *Attorney, Agent, or Firm*—N. Kenneth Burraston

(57) ABSTRACT

Products and assemblies are provided for socketably receiving elongate interconnection elements, such as spring contact elements, extending from electronic components, such as semiconductor devices. Socket substrates are provided with capture pads for receiving ends of elongate interconnection elements extending from electronic components. Various capture pad configurations are disclosed. Connections to external devices are provided via conductive traces adjacent the surface of the socket substrate. The socket substrate may be supported by a support substrate. In a particularly preferred embodiment the capture pads are formed directly on a primary substrate such as a printed circuit board.

14 Claims, 15 Drawing Sheets

U.S. PATENT DOCUMENTS

| | | | |
|---|---|---|---|
| 4,511,201 A | | 4/1985 | Baker et al. |
| 4,553,192 A | | 11/1985 | Babuka et al. |
| 4,711,024 A | * | 12/1987 | Russell .................. 29/832 |
| 4,787,853 A | * | 11/1988 | Igarashi .................. 439/55 |
| 4,922,376 A | * | 5/1990 | Pommer et al. ............ 361/715 |
| 4,933,808 A | * | 6/1990 | Horton et al. ............. 361/715 |
| 4,940,181 A | | 7/1990 | Juskey, Jr. et al. |
| 4,966,556 A | | 10/1990 | Reymond |
| 5,036,431 A | | 7/1991 | Adachi et al. |
| 5,055,777 A | | 10/1991 | Bonelli et al. |
| 5,106,309 A | | 4/1992 | Matsuoka et al. |
| 5,175,491 A | | 12/1992 | Ewers |
| 5,195,237 A | | 3/1993 | Cray et al. |
| 5,207,585 A | | 5/1993 | Byrnes et al. |
| 5,214,308 A | | 5/1993 | Nishiguchi et al. |
| 5,239,260 A | | 8/1993 | Widder et al. |
| 5,329,423 A | | 7/1994 | Scholz |
| 5,366,380 A | * | 11/1994 | Reymond .................. 439/66 |
| 5,455,390 A | | 10/1995 | DiStefano et al. |
| 5,475,317 A | * | 12/1995 | Smith .................. 324/760 |
| 5,476,818 A | | 12/1995 | Yanof et al. |
| 5,495,667 A | * | 3/1996 | Farnworth et al. ............ 29/843 |
| 5,500,605 A | | 3/1996 | Chang |
| 5,561,594 A | | 10/1996 | Wakefield |
| 5,578,870 A | | 11/1996 | Farnsworth et al. |
| 5,635,832 A | | 6/1997 | Ito et al. |
| 5,686,842 A | | 11/1997 | Lee |
| 5,714,803 A | | 2/1998 | Queyssac |
| 5,764,486 A | | 6/1998 | Pendse |
| 5,772,451 A | | 6/1998 | Dozier, II et al. |
| 5,811,982 A | | 9/1998 | Beaman et al. |
| 5,865,639 A | | 2/1999 | Fuchigami et al. |
| 5,874,780 A | | 2/1999 | Murakami |
| 5,932,891 A | | 8/1999 | Higashi et al. |
| 5,949,242 A | * | 9/1999 | Wood et al. .................. 324/760 |
| 6,002,266 A | | 12/1999 | Briggs et al. |
| 6,018,249 A | * | 1/2000 | Akram et al. ............... 324/758 |
| 6,025,730 A | | 2/2000 | Akram |
| 6,031,282 A | | 2/2000 | Jones et al. |
| 6,033,935 A | | 3/2000 | Dozier et al. |
| 6,060,891 A | | 5/2000 | Hembree et al. |
| 6,064,213 A | | 5/2000 | Khandros et al. |
| 6,087,845 A | | 7/2000 | Wood et al. |
| 6,229,320 B1 | | 5/2001 | Haseyama et al. |
| 6,232,149 B1 | | 5/2001 | Dozier et al. |
| 6,292,003 B1 | | 9/2001 | Fredrickson et al. |
| 6,336,269 B1 | | 1/2002 | Eldridge et al. |
| 6,452,406 B1 | | 9/2002 | Beaman |
| 6,525,555 B1 | | 2/2003 | Khandros et al. |
| 6,534,856 B1 | | 3/2003 | Dozier, II et al. |
| 6,642,625 B2 | | 11/2003 | Dozier, II et al. |
| 2001/0020545 A1 | | 9/2001 | Eldridge et al. |
| 2001/0020546 A1 | | 9/2001 | Eldridge et al. |
| 2002/0004320 A1 | | 1/2002 | Pedersen et al. |
| 2002/0117330 A1 | | 8/2002 | Eldridge et al. |
| 2003/0107394 A1 | | 6/2003 | Khandros et al. |
| 2004/0064941 A1 | | 4/2004 | Dozier, II et al. |

FOREIGN PATENT DOCUMENTS

| | | |
|---|---|---|
| EP | 072492 | 2/1983 |
| JP | 60-049656 | 3/1985 |
| JP | 02-34949 | 2/1990 |
| JP | 03-142847 | 6/1991 |
| JP | 60-49656 | 2/1994 |
| JP | 07-263-092 | 10/1995 |
| JP | 08-263092 | 10/1995 |
| JP | 09-508241 | 8/1997 |
| JP | 09-260535 | 10/1997 |
| JP | 10-069955 | 3/1998 |
| TW | 328643 | 3/1998 |
| WO | WO 95/14314 | 5/1995 |
| WO | WO 96/15459 | 5/1996 |
| WO | WO 96/15551 | 5/1996 |
| WO | WO 97/43656 | 11/1997 |

OTHER PUBLICATIONS

"Composite-Contact Interconnection Scheme," IBM Technical Disclosure Bulletin, vol. 33, No. 5, pp. 394-395 (Oct. 1990).

Cameron, "Installation Of Chips On Printed Circuit Cards," IBM Technical Disclosure Bulletin, vol. 11, No. 8, p. 971 (Jan. 1969).

Falda, "Pluggable Stacked Module," IBM Technical Disclosure Bulletin, vol. 23, No. 12, pp. 5410-5411 (May 1981).

Hinkley, "Packaging Techniques," IBM Technical Disclosure Bulletin, vol. 9, No. 7, p. 765 (Dec. 1966).

* cited by examiner

SOCKET FOR MATING WITH ELECTRONIC COMPONENT, PARTICULARLY SEMICONDUCTOR DEVICE WITH SPRING PACKAGING, FOR FIXTURING, TESTING, BURNING-IN OR OPERATING SUCH A COMPONENT

CROSS-REFERENCES TO RELATED APPLICATIONS

This application is a continuation of U.S. patent application Ser. No. 09/205,502, filed 4 Dec. 1998 (now abandoned), which is a continuation-in-part of U.S. patent application Ser. No. 08/784,862 filed 15 Jan. 1997 by Khandros and Pedersen (now U.S. Pat. No. 6,064,213).

U.S. patent application Ser. No. 09/205,502 is also a continuation-in-part of U.S. patent application Ser. No. 09/108,163 filed 30 Jun. 1998 by Dozier, Eldridge, Grube, Khandros, Mathieu, Pedersen, and Stadt (now U.S. Pat. No. 6,033,935).

U.S. patent application Ser. No. 09/205,502 is also a continuation-in-part of U.S. patent application Ser. No. 08/452,255 filed 26 May 1995 by Eldridge, Grube, Khandros, and Mathieu (now U.S. Pat. No. 6,336,269).

FIELD OF THE INVENTION

The invention relates to a socket for an electronic component, particularly for mating with a semiconductor with spring packaging (MicroSpring™ contacts). The socket is useful for contacting a device in a variety of configurations, from single device up to full-wafer, and can be used for securing, contacting, testing, and burning-in as well as regular operation of the device.

BACKGROUND OF THE INVENTION

The subject of chip scale packaging has been the focus of intense study in the industry for many years. One very promising technology involves securing small, resilient members onto a suitable substrate and using these members to effect contact between an active device and other circuitry.

Commonly-owned U.S. patent application Ser. No. 08/152,812 filed 16 Nov. 93 (now U.S. Pat. No. 4,576,211, issued 19 Dec. 95), and its counterpart commonly-owned copending "divisional" U.S. patent application Ser. No. 08/457,479 filed 01 Jun. 95 (status: pending) and Ser. No. 08/570,230 filed 11 Dec. 95 (status: pending), all by KHANDROS, disclose methods for making resilient interconnection elements for microelectronics applications involving mounting an end of a flexible elongate core element (e.g., wire "stem" or "skeleton") to a terminal on an electronic component, coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices.

Commonly-owned, copending U.S. patent application Ser. No. 08/340,144 filed 15 Nov. 94 and its corresponding PCT Patent Application No. PCT/US94/13373 filed 16 Nov. 94 (WO95/14314, published 26 May 95), both by KHANDROS and MATHIEU, disclose a number of applications for the aforementioned spring contact elements, such as making an interposer. The application also discloses techniques for fabricating contact pads (contact tip structures) at the ends of the spring contact elements.

Commonly-owned, copending U.S. patent application Ser. No. 08/452,255 filed 26 May 95 and its corresponding PCT Patent Application No. PCT/US95/14909 filed 13 Nov. 95 (WO96/17278, published 06 Jun. 96), both by ELDRIDGE, GRUBE, KHANDROS and MATHIEU, disclose additional techniques and metallurgies for fabricating spring contact elements such as composite interconnection elements, and for fabricating and mounting contact tip structures to the free ends (tips) of the composite interconnection elements.

Commonly-owned, copending U.S. patent application Ser. No. 08/558,332 filed 15 Nov. 95 by ELDRIDGE, GRUBE, KHANDROS and MATHIEU, and its corresponding PCT Patent Application No. US95/14885 filed 15 Nov. 95 by ELDRIDGE, GRUBE, KHANDROS and MATHIEU disclose methods of fabricating resilient contact structures which are particularly well-suited to fabricating spring contact elements directly on semiconductor devices.

The present invention addresses and is particularly well-suited to making interconnections to modern microelectronic devices at a fine-pitch. As used herein, the term "fine-pitch" refers to microelectronic devices that have their terminals (in the case of the present invention, their interconnection elements) disposed at a spacing of less than about 5 mils, such as 2.5 mils or 65 µm. The invention however is useful with devices with any pitch (e.g. millimeter or larger), but particularly pitch below about 15 mils (375 µm). As just one useful example, a device may be fitted with springs in an area array with spacing of approximately 10 mils (250 µm). A corresponding connection element would have the same pitch as the contact areas of the springs. For example, a corresponding socket would have a corresponding pattern of capture pads with the same pitch to receive the array of springs.

In the main are described, hereinafter, socketably receiving electronic components which are semiconductor devices, and which have interconnection elements which are elongate interconnection elements, more particularly which are spring contact elements extending from a surface thereof. As used herein, a semiconductor device having spring contact elements mounted thereto is termed a springed semiconductor device.

A springed semiconductor device may be interconnected to an interconnection substrate in one of two principal ways. It may be permanently connected such as by soldering the free ends of the spring contact elements to corresponding terminals on an interconnection substrate such as a printed circuit board. Alternatively, it may be reversibly connected to the terminals simply by urging the springed semiconductor device against the interconnection substrate so that a pressure connection is made between the terminals and contact portions of the spring contact elements. Such a reversible pressure connection can be described as self-socketing for the springed semiconductor device.

The ability to remove a springed semiconductor device from a pressure connection with an interconnection substrate would be useful in the context of replacing or upgrading the springed semiconductor device. A very useful object is achieved simply by making reversible connections to a springed semiconductor device. This is particularly useful for testing the springed semiconductor device. This also is useful for mounting, temporarily or permanently, to an interconnection substrate of a system to (1) burn-in the springed semiconductor device or (2) to ascertain whether the springed semiconductor device is measuring up to its specifications. As a general proposition, this can be accomplished by making pressure connections with the spring contact elements. Such contact may have relaxed constraints on contact force and the like. The present invention discloses a number of techniques for socketing to springed semiconductor devices.

Commonly-owned, copending U.S. patent application Ser. No. 08/533,385 filed 18 Oct. 95 by DOZIER, ELDRIDGE, GRUBE, KHANDROS and MATHIEU, and its corresponding PCT Patent Application No. US95/14842 filed 13 Nov. 95 by DOZIER, ELDRIDGE, GRUBE, KHANDROS and MATHIEU disclose socket substrates having spring contact elements for making reversible connections to an active semiconductor device. The socket is in turn secured and connected to electronic circuitry. In a most general manner, the present invention addresses what could be considered to be an analogous but reverse situation—namely, making reversible connections to electronic components having spring contact elements with socket substrates.

Commonly-owned, copending U.S. patent application Ser. No. 08/784,862 filed 15 Jan. 97 by KHANDROS AND PEDERSEN, and its counterpart PCT Patent Application No. US97/08604 filed 15 May 97 by KHANDROS AND PEDERSEN disclose a system for wafer-level burn-in and test wherein a plurality of relatively small, active electronic components, such as application-specific integrated circuits (ASICs) are mounted to a relatively large interconnection substrate. A plurality of semiconductor devices are resident on a wafer under test (WUT).

Spring contact elements extend from the surfaces of the semiconductor devices and are suitably, but are not limited to, free-standing, elongate, interconnect elements such as are disclosed in the aforementioned commonly-owned, copending U.S. patent application Ser. No. 08/452,255 filed 26 May 95 and its counterpart PCT Patent application number US95/14909 filed 13 Nov. 95. As illustrated in FIG. 3B therein, a plurality of indentations, suitably in the form of inverse pyramids extend into an ASIC from the faces thereof. Metallization is applied to the sidewalls of these indentations, establishing electrical communication with circuitry elements of the ASIC.

In use, as an ASIC and the WUT are brought together, the tips of the spring contact elements on the WUT enter the indentations in the ASIC and engage the sidewalls of the indentations with sufficient force to ensure a reliable electrical pressure connection. As illustrated in FIG. 3C therein, each ASIC alternatively has a plurality of pads (terminals) formed in a conventional manner on its front surface, and a layer of insulating material. Such a silicon die may be micromachined to have a plurality of apertures extending therethrough and aligned with the contact pads and may be disposed over the front surface of the ASIC. The layer of insulating material provides comparable "capture" capability as the indentations formed in the ASICs. FIGS. 5A–5C of these patent applications illustrate a technique for making conductive vias through an ASIC, wherein indentations (first and second hole portions) are created from both sides of the ASIC until they become contiguous with one another. Then, a conductive layer (e.g., tungsten, titanium-tungsten, etc.) is deposited, such as by sputtering into the first and second hole portions, resulting in a first conductive layer portion extending into the first hole portion and a second conductive layer portion extending into the second hole portion. This is particularly interesting when the first and second hole portions are on opposite sides of a silicon substrate such as a wafer. Then a mass of conductive material (e.g., gold, nickel, etc.) is applied to connect (bridge) the conductive layers in the two hole portions. This mass of conductive material is suitably applied by plating.

Commonly-owned, copending U.S. patent application Ser. No. 09/108,163, filed 30 Jun. 1998 by ELDRIDGE, GRUBE, KHANDROS, MATHIEU, PEDERSEN, and STADT discloses a number of techniques for making reversible connections to a springed semiconductor device for the purpose of burning-in the springed semiconductor device and ascertaining whether the springed semiconductor device is capable of performing up to its specifications. For example, FIG. 2 of the patent application illustrates a technique wherein the springed semiconductor device is urged against an interconnection substrate such as a printed circuit board (PCB) so that the tips of the spring contact elements come into pressure contact with a corresponding plurality of terminals on the PCB to establish a pressure connection therewith. For example, FIG. 4 of the patent application illustrates a technique wherein end portions of the spring contact elements are inserted into plated through-hole terminals of an interconnection substrate such as a printed circuit board. For example, FIG. 5A of the patent application illustrates a technique wherein the ends of the spring contact elements are brought into contact with corresponding ones of a plurality of concave terminals of an interconnection substrate. The concave terminals are formed like plated through-holes that have an upper portion in the form of a cone or pyramid which has its base at an upper surface of the interconnection substrate and its apex (point) within the interconnection substrate. FIG. 5B of the patent application illustrates concave terminals, each in the form of a hemisphere which has its base at an upper surface of the interconnection substrate and its apex within the interconnection substrate. FIG. 5C of the patent application illustrates concave terminals that have an upper portion in the form of a trapezoidal solid which has relatively wider base portion at an upper surface of the interconnection substrate and its relatively more narrow base portion within the interconnection substrate. In each of the examples of FIGS. 5A, 5B and 5C of the patent application, the tip of the spring contact structure enters the concave terminal at its widest portion, thus allowing easier entry and guiding or "capturing" the ends of the spring contact elements with the terminals.

SUMMARY OF THE INVENTION

It is therefore an object of the invention to provide techniques for socketably receiving an elongate interconnection element extending from an electronic component. A preferred electronic component is a semiconductor device. A preferred elongate interconnection element is a spring contact element.

According to a primary aspect of the invention, an apparatus and techniques are disclosed for socketably receiving a single springed semiconductor device with a single socket substrate. (See, e.g., FIGS. 5, 5A, 5B, 5C and 5D). Referring to FIG. 5, a semiconductor device can be positioned so elongate interconnection elements mate with capture pads on a socket substrate. A housing is secured over the semiconductor to hold it in place, and secured to the primary substrate. A spring mechanism in the housing provides tension to hold the semiconductor in place. In a particularly preferred mechanism, a simple housing with legs, resembling a table, is pressed directly against the semiconductor in position with capture pads directly on a substrate such as a printed circuit board. The legs are positioned through holes in the substrate and locked in place. "Hot staking" by melting a thermoplastic material is particularly preferred.

According to the invention, a socket substrate is provided with "capture pads" for making reversible connections with one or more interconnection elements extending from an electronic component. FIG. 1C illustrates a preferred embodiment of an electronic component (108) having an elongate interconnection element (130) in the form of a spring contact element extending from the component.

According to another aspect of the invention, the electronic component may be a semiconductor device having interconnection elements which are spring contact elements extending therefrom. Such devices are termed "springed semiconductor devices" herein.

According to another aspect of the invention, the capture pads on the socket substrate are flat pads. The capture pads may be recessed below the surface of the socket substrate. (See, e.g., FIGS. 2, 2A and 2B) Recessed capture pads assist in physically positioning the ends of the elongate interconnection elements.

According to another aspect of the invention, the capture pads on the socket substrate are concave, extending into the surface of the socket substrate, including hemispherical depressions, inverted pyramid pits, and inverted truncated pyramid pits. (See, e.g., FIGS. 2C, 2D and 2E). Concave terminals also assist in physically "capturing" the ends of the elongate interconnection elements.

According to another aspect of the invention, the capture pads on the socket substrate are holes extending through the socket substrate. Such holes can take many forms, including cylindrical holes and holes which are hourglass-shaped (apex-to-apex inverted pyramid pits). (See, e.g., FIG. 2F) Through-hole type terminals facilitate making connections to the socket substrate via the reverse side of the substrate. Techniques are disclosed for making symmetrical and asymmetrical hourglass-shaped through-hole terminals in a silicon socket substrate. (See, e.g., FIGS. 4A–4I) These techniques take advantage of the natural propensity of 1,0,0 silicon to etch at an angle, and for the etching to be self-limiting.

According to another aspect of the invention, connections are made by external devices to the socket substrate via conductive traces which are upon (see, e.g., FIGS. 2 and 3A) or within (see, e.g., FIG. 2A) the surface of the socket substrate. Conductive traces permit routing, such as between a contact point and a terminal or other circuitry.

According to another aspect of the invention, the socket substrate is supported by a support substrate which may also function as an interconnection substrate (See, e.g., FIGS. 3B, 3C and 6A). Connections to external devices may be made via the support/interconnection substrate (See, e.g., FIGS. 3B and 3C).

According to another aspect of the invention, techniques are disclosed for socketably receiving a plurality of springed semiconductor devices with a plurality of socket substrates. (See, e.g., FIGS. 7 & 7A).

According to another aspect of the invention, techniques are disclosed for socketably receiving a plurality of springed semiconductor devices with a single large socket substrate. (See, e.g., FIG. 7B).

According to another aspect of the invention, techniques are disclosed for socketably receiving a plurality of springed semiconductor devices resident on a semiconductor wafer under test (WUT) with a single very large socket substrate. (See, e.g., FIGS. 8, 8A, 8B and 8C).

According to another aspect of the invention, techniques are disclosed for socketably receiving a sequence of one or more springed semiconductor devices resident on a semiconductor wafer with one or more socket substrates. (See, e.g., FIG. 9).

According to another aspect of the invention, an overall process is disclosed for fabricating springed semiconductor devices. (See, e.g., FIG. 10).

This and other objects and advantages of the invention, as well as the details of an illustrative embodiment, will be more fully understood from the following specification and drawings.

BRIEF DESCRIPTION OF THE DRAWINGS

Reference will now be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments. In the side views presented herein, often only portions of the side view are presented in cross-section, and portions may be shown in perspective, for illustrative clarity. In the figures presented herein, the size of certain elements are often exaggerated (not to scale, vis-à-vis other elements in the figure), for illustrative clarity.

DESCRIPTION OF THE PREFERRED EMBODIMENTS

Mounting Spring Contact Elements to Semiconductor Devices

Figure 1A:
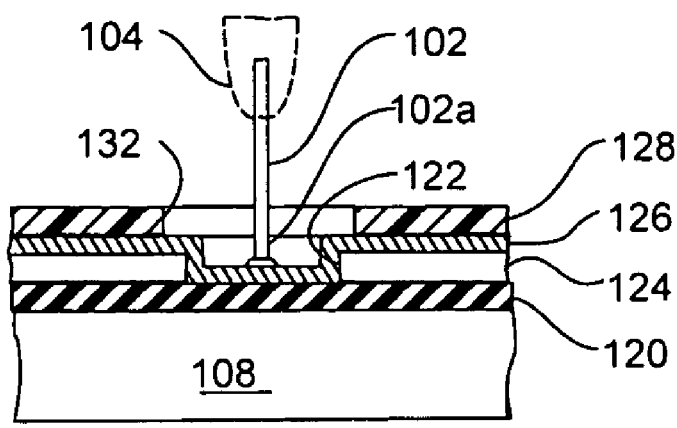
FIG. 1A is a side cross-sectional view of a step in making a spring contact element which is a composite interconnection element, according to the invention.
Figure 1B:
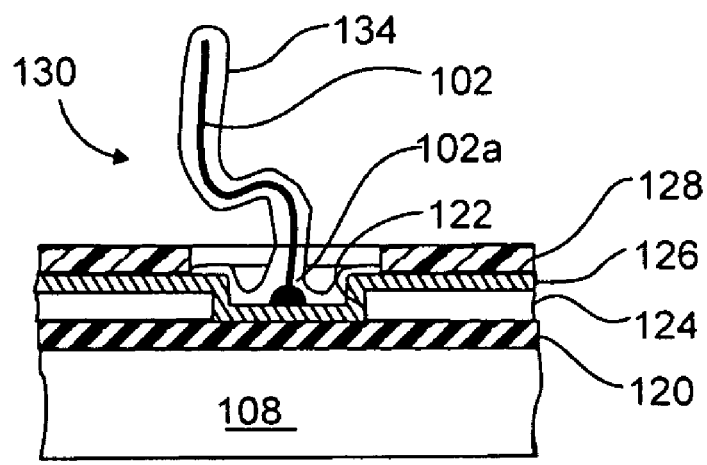
FIG. 1B is a side cross-sectional view of a further step in making the spring contact element of FIG. 1A, according to the invention.
Figure 1C:
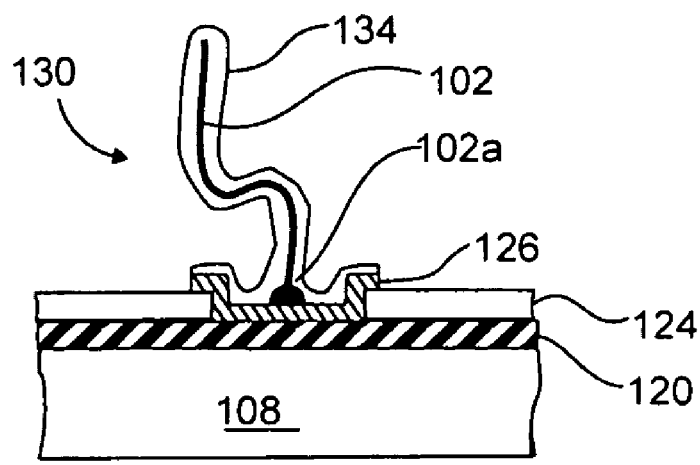
FIG. 1C is a side cross-sectional view of a spring contact element after FIG. 1B, according to the invention.

The aforementioned commonly-owned PCT Patent Application No. US95/14909, in the text accompanying FIGS. 1C, 1D and 1E thereof, reproduced herein as FIGS. 1A, 1B and 1C, discloses an exemplary technique for fabricating spring contact elements of the aforementioned composite interconnection type on electronic components which are semiconductor devices. A useful technique is disclosed in detail in U.S. Pat. No. 5,772,451, issued Jun. 30, 1998, entitled "Sockets for Electronic Components and Methods of Connecting to Electronic Components" and U.S. Pat. No. 5,806,181, issued Sep. 15, 1998, entitled "Contact Carriers (Tiles) for Populating Larger Substrates with Spring Contacts."

Referring now to FIGS. 1A, 1B and 1C, an exemplary technique for fabricating resilient, elongate, free-standing spring contact elements gives composite interconnection elements on an electronic component 108. In a particularly preferred embodiment, electronic component 108 may be a semiconductor device. A conductive layer 126 of a conductive material is deposited over passivation layer 124. Photoresist 128 is applied and patterned with openings 132 aligned over openings 122 in the passivation layer. A free end 102a of a wire 102 is bonded to a surface of the electronic component 108, then plated with one or more layers of a conductive material to give a spring contact element which is a free-standing elongate composite interconnection structure. The photoresist 128 and resist-covered portions of conductive layer 126 are removed.

The spring contact element 130 shown in FIG. 1C is a composite interconnection element which is elongate and has a base (proximal) end which is mounted to the electronic component 108 and a free (distal) end (tip) at its opposite end. This is useful for making a pressure contact with a terminal or other contact of another electronic component (see FIGS. 2, 2A–2F).

Other resilient contacts are useful in certain preferred embodiments. For example, the resilient contact structures of WO 97/43654, published 20 Nov. 1997, or of WO 97/44676, published 27 Nov. 1997, are particularly preferred. These resilient contact elements are plated in a desired form directly on a semiconductor device, or in an intermediary, sacrificial substrate from which the contacts are secured to the desired semiconductor device and the sacrificial substrate is removed.

Still other resilient contacts are useful in the present invention. By way of example, a particularly useful contact is made according to the disclosure of U.S. application Ser.

No. 09/032,473, filed 26 Feb. 1998, entitled "Lithographically Defined Microelectronic Contact Structures", by Pedersen and Khandros.

A Simple Socketing Technique

Figure 2:
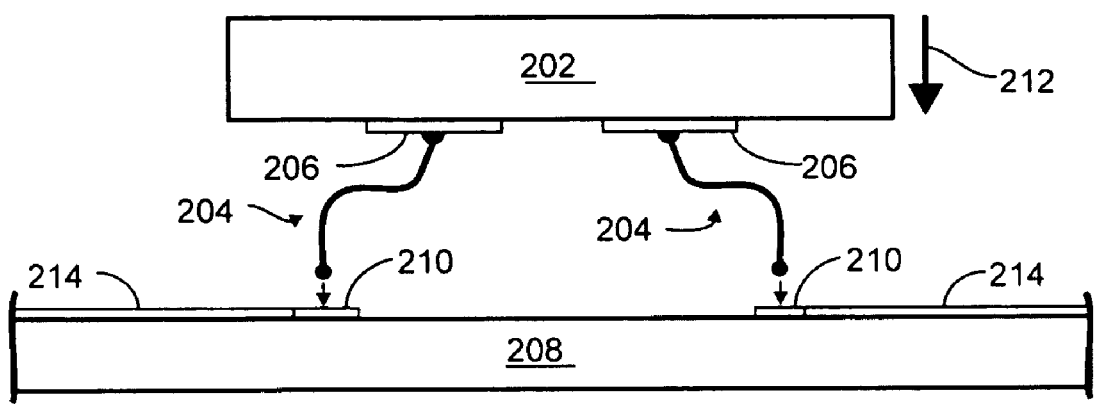
FIG. 2 is a side cross-sectional view illustrating urging a springed semiconductor device into contact with flat capture pads (terminals) of an interconnection substrate, according to the invention.

FIG. 2 illustrates one preferred, basic socketing technique. In this example, assembly 200 includes an electronic component 202 with one or more interconnection elements, each in the form of a spring contact element 204 mounted to and extending from a corresponding terminal 206. A socket substrate 208 has one or more capture pads 210, each in the form of a flat terminal on a surface as illustrated. In one particularly preferred embodiment, electronic component 202 is a semiconductor device.

The socket substrate 208 may take many forms including any suitable insulating material such as ceramic or PCB. One particularly preferred socket substrate is silicon. Silicon may be used directly as a semiconductor, or may be treated to insulate and isolate the conductive elements shown. The substrate may itself be an active semiconductor device. The socket substrate may be a silicon wafer, or some portion of a silicon wafer.

The electronic component 202 is urged against the socket substrate 208, as indicated by the arrow 212, so that the tips (distal ends) of the spring contact elements 204 engage and make electrical contact with corresponding capture pads 210.

Conductive traces 214 may be provided on the socket substrate 208. A conductive trace 214 extends from a capture pad 210 so that an electrical connection can be made to the corresponding terminal 206 on the electronic component 202. This is particularly useful for connecting an external device such as a tester (not shown) via capture pads 210 via spring contact elements 204 to the electronic component 202.

The connection between the electronic component and the socket substrate depends on sufficient contact between these components. The electronic component can be removed from the socket substrate. Thus multiple or repeated combinations of different electronic components and/or different socket substrates allow repeated insertion of various or even the same electronic component with a given socket substrate. This is particularly useful for mounting a semiconductor device in a finished product, much as other sockets are widely used today for mounting a package containing a semiconductor device.

This also is particularly useful for burn-in or test of a semiconductor device. In the burn-in or test instance, a socket and supporting electronics can be designed for securing and contacting the semiconductor device to carry out the desired tests. The difference here, however, is that the semiconductor device is socketed directly, without separate packaging.

In this manner, the socket substrate 208 functions as a socket for effecting reversible connections to an electronic component 202 having raised contact elements extending from a surface thereof. Other socket configurations are disclosed hereinbelow.

In making an electrical connection between a spring contact element 204 and a corresponding capture pad 210, it is generally helpful if there is some wiping action, generally in the form of a lateral displacement of the tip of a contact element across the surface of the capture pad. This is helpful in that it tends to displace or dig through any residue or contaminants on the surface of the capture pad or on the tip of the spring contact element. By choosing a suitable shape for the spring contact element 204, a displacement of the electronic component 202 in the direction 212 (in the Z axis of the socket substrate 208) will deform the contact element in the opposing Z direction. A resilient contact element can be shaped so that a response to this Z displacement includes a component vector movement in the XY plane perpendicular to the Z axis. In a preferred embodiment, the shape of the resilient contact element is designed so this XY component moves the tip of the electronic component contact element along the contact pad to give a useful wiping motion. An alternative wiping motion can be introduced by physically displacing the socket substrate relative to the semiconductor device in the XY plane as or after the tip of the contact element is brought into contact with the capture pad. One skilled in the art can design a useful spring shape to generate some wiping motion between a selected contact element and a corresponding contact pad.

A conductive trace 214 can be connected to other circuitry, for example to an external electronic device or to a contact point or terminal for connection to an external electronic device. Other circuitry may be incorporated in the socket substrate and connected to a conductive trace for ultimate connection to the electronic component through one or more interconnection elements 204.

A Second Socket Configuration

Figure 2A:
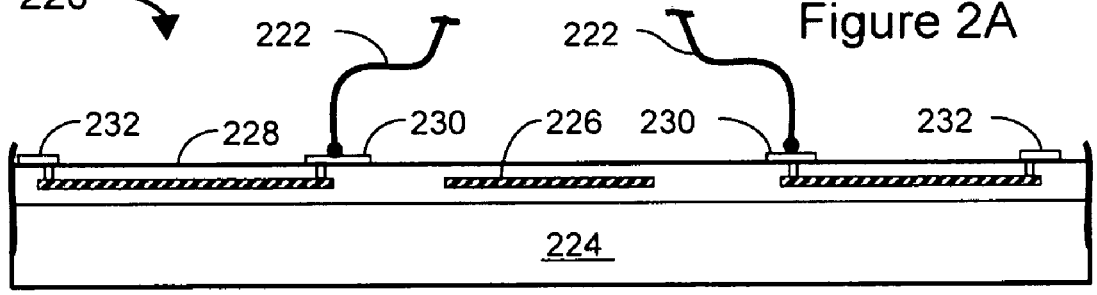
FIG. 2A is a side cross-sectional view illustrating urging a springed semiconductor device into contact with flat capture pads of an interconnection substrate, according to the invention.

FIG. 2A illustrates another socket 220 for effecting connections with interconnection elements 222 (compare 204) of an electronic component (not shown). Socket substrate 224 can be like socket substrate 208. Metallization layers are formed in a known manner on the surface of the socket substrate 224, and include one or more layers of insulating material and one or more layers of metallization. These layers can be patterned according to standard techniques. In this illustration, a layer 226 of metallization is shown embedded in insulating material 228. Another layer of metallization is exposed and accessible, and forms capture pads 230 for making connections to the ends of the interconnection elements 222 and second terminals 232 for making connections to an external device (not shown). Selected ones of the capture pads 230 are electrically connected to selected ones of the second terminals 232 via selected portions of the metallization 226 and suitable internal connections, using techniques known in the art. Multiple layers of connectivity can be fabricated. In this manner, complex routing schemes can be effected.

A Third Socket Configuration

Figure 2B:
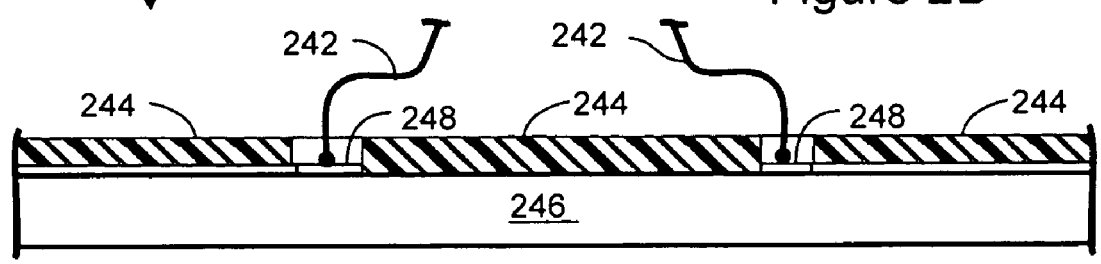
FIG. 2B is a side cross-sectional view illustrating urging a springed semiconductor device into contact with flat terminals of an interconnection substrate, according to the invention.

FIG. 2B illustrates another socket 240 for effecting reversible connections with interconnection elements 242 (compare 222) of an electronic component (not shown). In this example, an insulating layer 244 is applied over the socket substrate 246 (compare 224) with openings through which capture pads 248 are exposed. These openings in the insulating layer 244 help to position the ends of the interconnection elements 242 against the capture pads 248, particularly as the interconnection elements are first brought into alignment with and approximately positioned against the capture pads 248. Where the socket substrate is a semiconductor wafer or portion thereof, the insulating layer 244 can be applied as a conventional passivation layer. The insulating layer 244 provides physical protection for the conductive traces (e.g., 214 in FIG. 2). For example, this insulating layer 244 may prevent misdirection of signals or electrical energy if an interconnection element 242 is improperly positioned and misses a corresponding capture pad 248.

A Fourth Socket Configuration

Figure 2C:
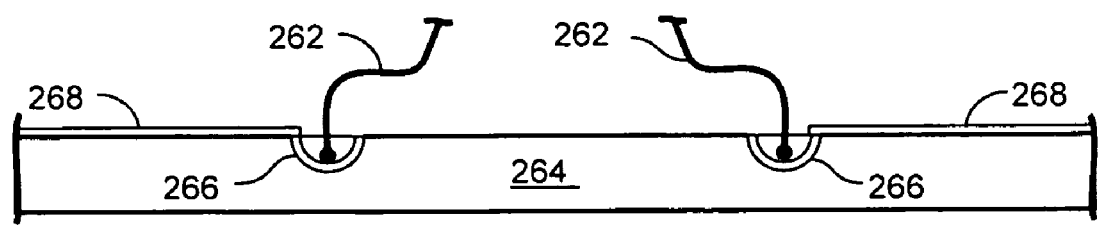
FIG. 2C is a side cross-sectional view illustrating urging a springed semiconductor device into contact with concave hemispherical terminals of an interconnection substrate, according to the invention.

FIG. 2C illustrates another socket 260 for effecting connections with interconnection elements 262 (compare 242)

of an electronic component (not shown). In this example, the socket substrate 264 (compare 246) has capture pads 266 which are concave, rather than flat (compare capture pads 210, 230, 248). in one preferred embodiment, capture pads 266 are depressed into the surface of the socket substrate 264, or into the surface of layers overlying the socket substrate (compare 228 in FIG. 2A). The concave capture pads 266 are illustrated as hemispherical, having a diameter which is greater than the diameter of the end of the interconnection element 262 coming into contact with the capture pad 266, and help to guide or locate the end of the interconnection element against the capture pads.

In the manner described hereinabove, conductive traces 268 (compare 214 in FIG. 2) suitably extend from the capture pads 266 to other locations on the socket substrate 264.

It is within the scope of this invention that the terminals may have other shapes, such as cylindrical depressions extending into the surface of the socket substrate or a layer overlying the socket substrate. As used herein, "concave" includes cylindrical.

A Fifth Socket Configuration

Figure 2D:
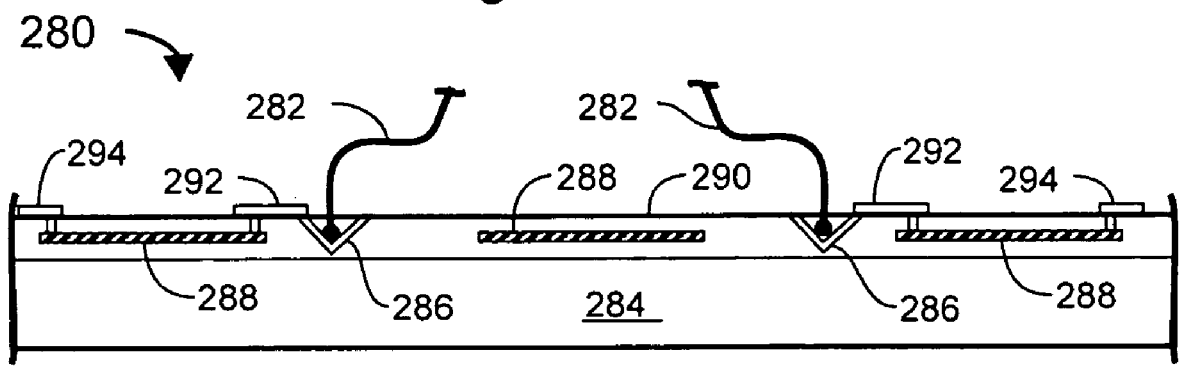
FIG. 2D is a side cross-sectional view illustrating urging a springed semiconductor device into contact with concave pyramid-like terminals of an interconnection substrate, according to the invention.

FIG. 2D illustrates another socket 280 for effecting reversible connections with interconnection elements 282 (compare 262) of an electronic component (not shown). In this example, the socket substrate 284 (compare 264) is provided with 'concave' capture pads 286 (compare 266), suitably in the form of inverted pyramids. In a preferred embodiment, metallization layers are formed in a known manner on the surface of the socket substrate 284 (compare 224), and include one or more layers of insulating material and one or more layers of metallization. In this illustration, a layer 288 (compare 226) of metallization is shown embedded in insulating material 290 (compare 228). Another layer of metallization is patterned to form first conductive traces 292 (compare 230) which are in electrical contact with respective ones of the capture pads 286 and conductive traces 294 (compare 232) for making connections to other circuitry. Selected ones of the first conductive traces 292 are electrically connected to selected ones of the second conductive traces 294 via selected portions of the embedded metallization 288.

A Sixth Socket Configuration

Figure 2E:
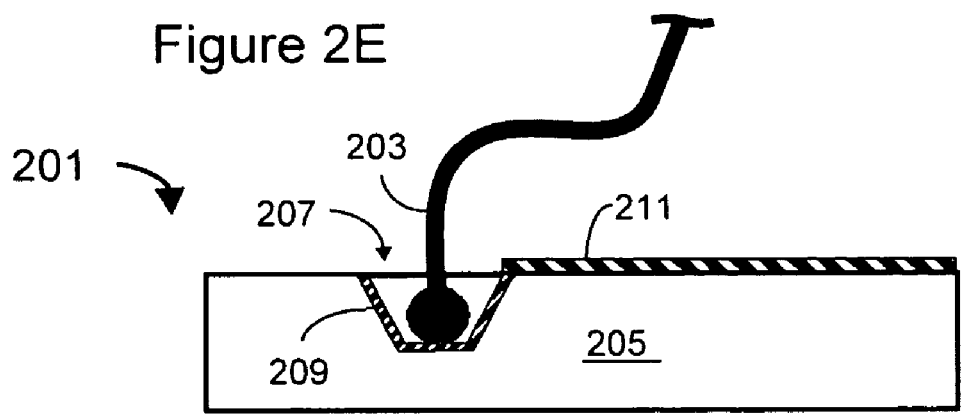
FIG. 2E is a side cross-sectional view illustrating urging a springed semiconductor device into contact with concave truncated pyramid-like terminals of an interconnection substrate, according to the invention.

FIG. 2E illustrates another socket 201 for effecting connections with interconnection elements 203 (compare 282) of an electronic component (not shown). In this illustrative example, the socket substrate 205 (compare 284) is provided with a concavity 207 in the form of an inverted pyramid with a flat bottomed surface. Such a concavity 207 can be made by masking a silicon wafer, etching, and terminating the etch prior to the angled sidewalls meeting at an apex (compare the pyramid shaped terminal 286 above). The concavity is metallized, as indicated by the metal layer 209. This forms a useful capture pad. A conductive trace 211 (compare 214 in FIG. 2) is shown on the socket substrate 205, connected to the metallization 209 (compare 210).

A Seventh Socket Configuration

In the socket configurations described with respect to FIGS. 2A–2E, hereinabove, connections between the terminal of the socket and an external device (not shown) will typically made by conductive traces (or metallization) on a first surface (or within a first surface) of the socket substrate. This first surface may be considered the "top" surface of the socket substrate.

Figure 2F:
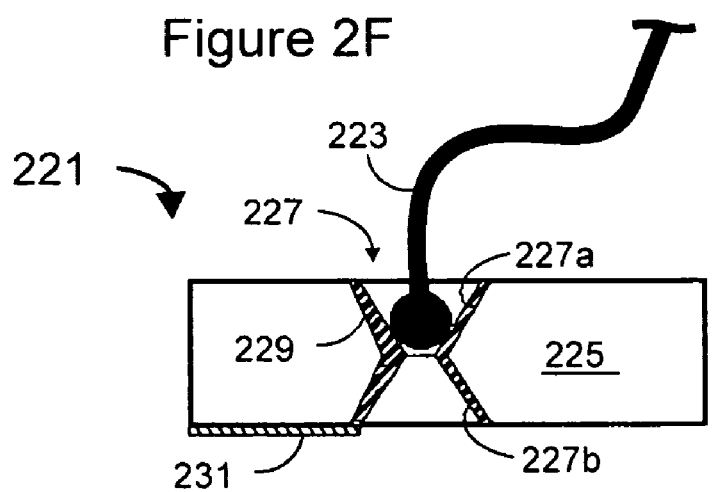
FIG. 2F is a side cross-sectional view illustrating urging a springed semiconductor device into contact with compound hourglass-like through-hole terminals of an interconnection substrate, according to the invention.

FIG. 2F illustrates another socket 221 for effecting reversible connections with interconnection elements 223 (only one shown, compare 203) of an electronic component (not shown). In a particularly preferred embodiment, the socket substrate is silicon, and may be all or a portion of a silicon wafer. The socket substrate 225 (compare 205) is provided with concavities 227 (one shown, compare 207), each of which are in the form of two inverted pyramids intersecting at their apexes. The concavity is metallized, as indicated by the metal layer 229 (compare 209). A method of making such a structure is described in detail below in connection with FIGS. 4–4I.

In this example, the top portion of the metallized concavity receives the free (distal) end of the interconnection element 223. Connections to external devices may be effected by connecting directly to the bottom portion of the concave terminal from the bottom surface of the socket substrate. A conductive trace 231 can be used to reposition a contact point, or to make a desired interconnection. Of course, conductive traces may be provided on either surface of the socket substrate, and one or more layers of metalization may be used. In this manner, it is possible to effect complex connection schemes.

Connecting to the Substrate

Figure 3A:
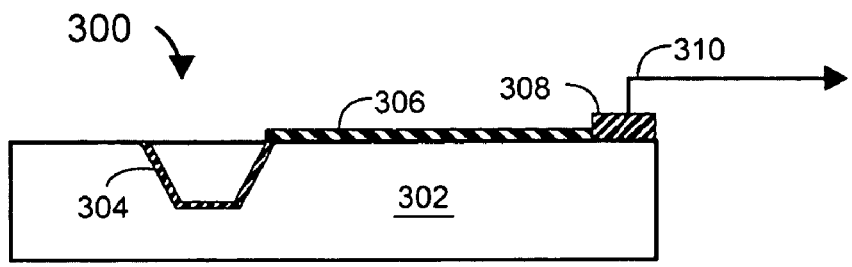
FIG. 3A is a side cross-sectional view illustrating connecting a socket substrate of the present invention to an external device (not shown), according to the invention.

FIG. 3A illustrates a socket 300 for connecting an external device to an electronic device through a socket substrate 302 having a capture pad 304 for receiving an end of an elongate interconnection element (not shown). Compare socket substrate 205 of FIG. 2E and the corresponding elements. Here, conductive trace 306 connects capture pad metallization 304 to terminal 308, illustrated at an edge of the substrate 302. The conductive trace 306 is merely illustrative, as the connection between the terminals 304 and 308 could as well be buried, as illustrated in FIGS. 2A and 2D and as known in the art. The arrow 310 schematically represents a connection that can be made by an external device to the terminal 308. Useful connections are well known, and include edge connectors with corresponding sockets, pogo pins, wirebonding, lead frames, and others.

Figure 3B:
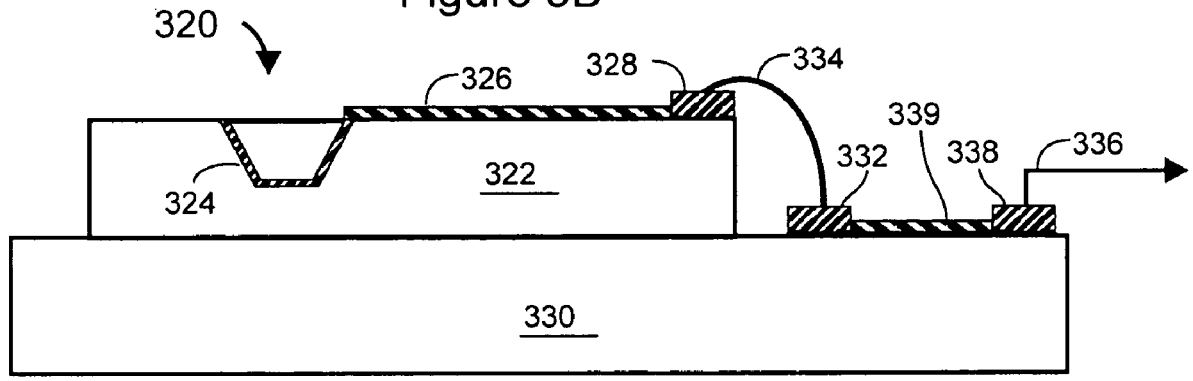
FIG. 3B is a side cross-sectional view illustrating for connecting a socket substrate of the present invention to an external device (not shown), according to the invention.

FIG. 3B illustrates a preferred embodiment of a socket assembly 320 for connecting an external device to a socket substrate 322 having a capture pad 324 for receiving an end of an elongate interconnection element (not shown, compare 203). In this example, a conductive trace 326 is provided on the substrate 322 and extends to terminal 328, here at an edge of the substrate 322. In this example, the socket substrate 322 is supported by a support substrate 330. The support substrate may be a variety of materials, preferably ceramic, silicon or PCB. The support substrate 330 has a terminal 332. The terminal 328 of the socket substrate 322 is electrically connected to the terminal 332 of the support substrate 330 by any suitable means, such as a bond wire 334, which may be attached using conventional wire bonding techniques. The arrow 336 schematically represents a connection that can be made by an external device to the terminal 338, and hence to capture pit 324.

Figure 3C:
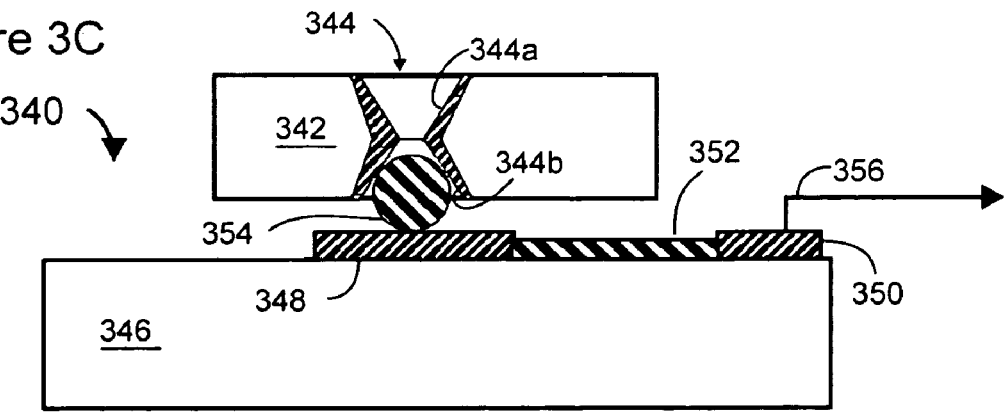
FIG. 3C is a side cross-sectional view illustrating for connecting a socket substrate of the present invention to an external device (not shown), according to the invention.

FIG. 3C illustrates another preferred embodiment of a socket, here socket 340. Socket substrate 342 has a capture pit 344 with a portion 344a (compare 227a) for receiving an end of an elongate interconnection element (not shown). In this example, the capture pit 344 extends completely through the socket substrate 342 and has a lower portion 344b (compare 227b) for making a further connection. In this embodiment, the support substrate 346 has a first terminal 348, a second terminal 350, and a conductive trace 352 connecting the two terminals 348 and 350. A mass of conductive material 354 (compare 334), such as solder, a solder ball, a dollop of conductive epoxy, or the like, is disposed within the lower portion 344b of the terminal 344 and extends away from the support substrate to effect an electrical connection between the terminal 344 of the socket substrate 342 and the terminal 348 of the support substrate 346. In this example, a connection, indicated by the arrow 356, is made to an external device (not shown) to the terminal 350.

Forming Through-Hole Terminals in Silicon

As discussed hereinabove in regard to FIGS. 2F and 3C, it is possible to provide the socket substrate (225, 346) with a through-hole type terminal, a top portion of which receives the free end of an elongate interconnection element, a bottom portion of which can be connected as desired.

In certain applications, it would be desirable to form the socket substrate from silicon. This is particularly helpful in an assembly which will be in close contact with an operating semiconductor device. Such devices generally become warm during use, or perhaps during testing, and it is very helpful to connect to materials which have a similar coefficient of thermal expansion so the active device and the contactor remain in a similar geometrical relationship. Matching a silicon device to another silicon device is particularly desirable.

FIGS. 4A–4F illustrate processing a structure 400 to form through-hole type terminals in a silicon substrate 402. See generally the discussion in PCT WO97/43656 ("Wafer-Level Burn-In and Test") regarding FIGS. 5A, 5B and 5C of that publication.

Figure 4A:
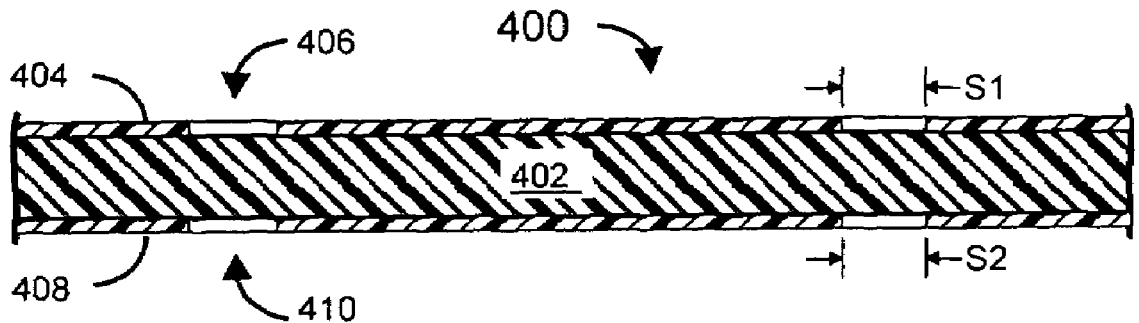
FIG. 4A–4F are side cross-sectional views illustrating fabricating capture pads which are hourglass-like throughholes in a socket substrate, according to the invention.

FIG. 4A illustrates a first step of the process. A layer 404 of nitride is applied to a front surface of a substrate 402 which is a piece of 1,0,0 silicon. The layer of nitride is patterned to have openings 406. These openings 406 are preferably square, having cross-dimensions (S1) of 150–250 µm, such as 200 µm. In a similar manner, a layer 408 of nitride is applied to a back surface of the substrate 402 and is patterned to have openings 410. The openings 410 in the nitride layer 408 are preferably square, having cross-dimensions (S2) of 150–250 µm, such as 200 µm. Selected ones and in general, each, of the openings 406 is located directly opposite a corresponding one of the openings 410. A pair of aligned openings 406 and 410 will determine the location of a through-hole terminal formed in the silicon substrate 402.

The openings 406 and 410 are illustrated as having the same cross-dimension as one another (i.e., S1=S2), but as will be discussed hereinbelow, this is not necessary and may not be preferred in some implementations.

In one preferred embodiment, openings equivalent to 406 and 410 are rectangular rather than square. Opposing openings can have rectangles oriented in parallel, or opposing openings could be orthogonal. In general, a rectangular opening will create a trough structure rather than a point when etched. The relative dimensions of each need not be the same.

Figure 4B:
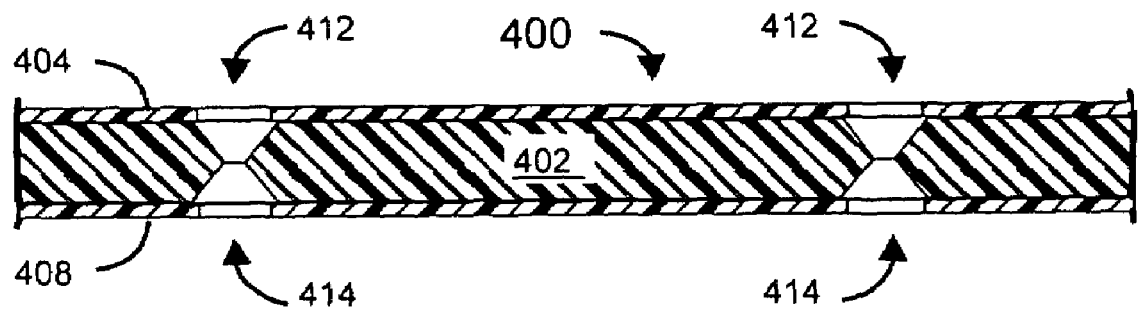

FIG. 4B illustrates a next step wherein the substrate 402 is etched within the openings 406 and 410, the nitride layers 404 and 408 acting as masking material to prevent etching other than at the openings 404 and 408. A suitable etchant is potassium hydroxide (KOH). A feature of 1,0,0 silicon is that it will etch in KOH at an angle, the angle being 53.7°. The etch procedes according to the crystal lattice of the silicon. Thus it is preferred that the openings such as 406 and 410 be oriented to align with the crystal lattice. The orientation of the lattice is known and generally indicated by a notch in the generally circular wafer of silicon.

Etching from only one side gives a pyramid shaped pit (compare 286 in FIG. 2D) extending into that side of the substrate. The dimensions of the pit are controlled by the dimension and orientation of the opening within which the etching occurs, and the etch angle of 1,0,0 silicon. The etching comes to a halt when there is no remaining exposed silicon on the surface of the substrate. In general, starting with a square opening, a pyramid-shaped pit is created. If the etch is not driven to completion, a truncated pyramid can be formed. Where the opening for etching is rectangular, a trough structure will be formed.

In a preferred embodiment, etching is from both sides, and two pyramid-shaped pits 412 and 414 "grow" towards one another. By ensuring that the openings are sufficiently wide, and the substrate is sufficiently thin, these two pyramid-shaped pits 412 and 414 will grow into one another (overlap), resulting in the "hourglass-shaped" through-holes illustrated in FIG. 4B. If desired, the pits may be allowed to "over-etch" so that the nitride layers 404 and 408 slightly overhang the pit openings. Once etching is done, the nitride layers 404 and 408 may be removed, by preferential etching.

Etching this hourglass forms a via in the silicon substrate. Vias are widely used in many electronic products such as semiconductor devices and multilayer substrates. This new via will be made electrically conducting, then can be used in many of the ways known for using vias.

Figure 4C:
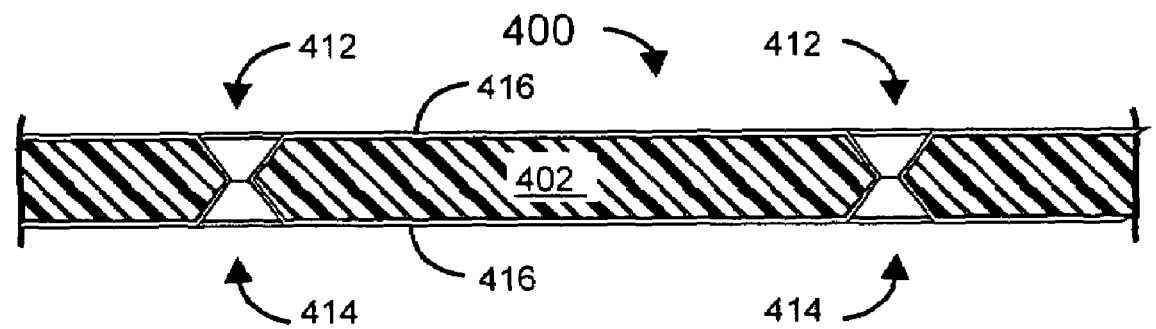

FIG. 4C illustrates a next step wherein the substrate 402 is re-nitrided, such as by thermally growing a very thin layer 416 of nitride on all the surfaces of the substrate 402, including within the sidewalls of the pits 412 and 414. This nitride functions in part to insulate the body of the semiconductor substrate from any subsequently applied conductive material.

Figure 4D:
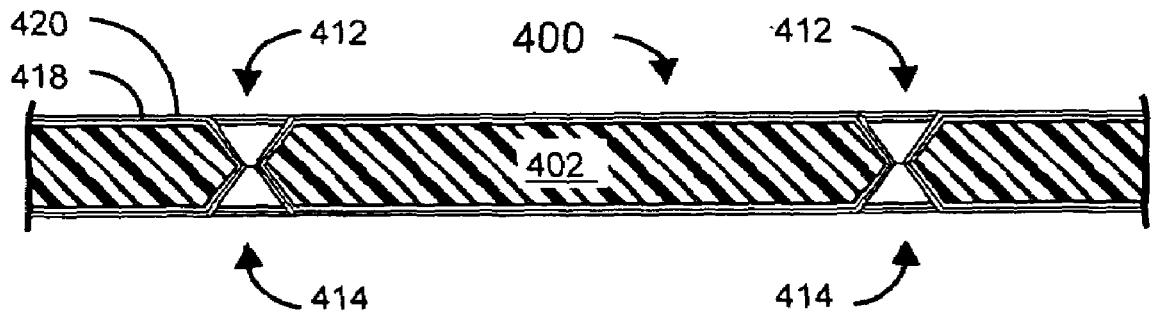

FIG. 4D illustrates a next step wherein the entire substrate 402 is coated (e.g., sputter-coated) with a thin layer 418 of titanium-tungsten (TiW), then a thin seed layer 420 of gold (Au). Representative dimensions and useful methods and materials are set forth in detail in copending, commonly assigned U.S. patent application Ser. No. 09/032,473, filed Feb. 26, 1998, entitled "Lithographically Defined Microelectronic Contact Structures", which is incorporated herein in full by reference.

Figure 4E:
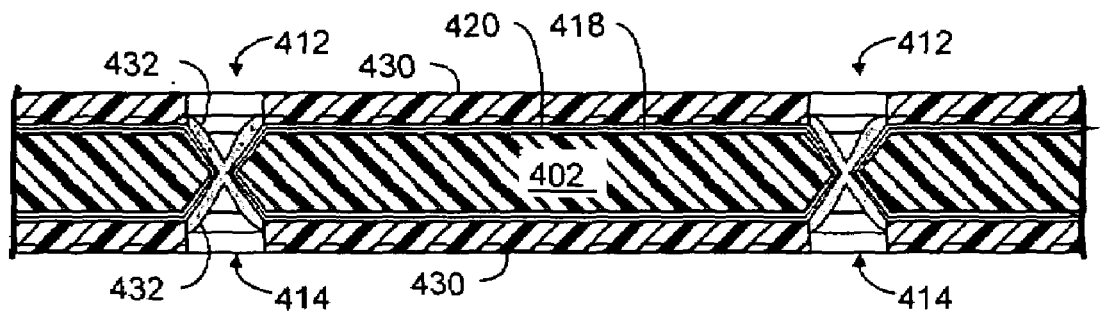

FIG. 4E illustrates a next step wherein layer 430 of masking material, such as photoresist, is applied to both sides of the substrate 402 and patterned to have openings aligned with the pits 412 and 414. The seed layer 420 within the pits is not covered by the masking material. Then, one or more layers of a conductive material 432 such as nickel is deposited, such as by plating, onto the exposed seed layer 420 within the pits 412 and 414.

Figure 4F:
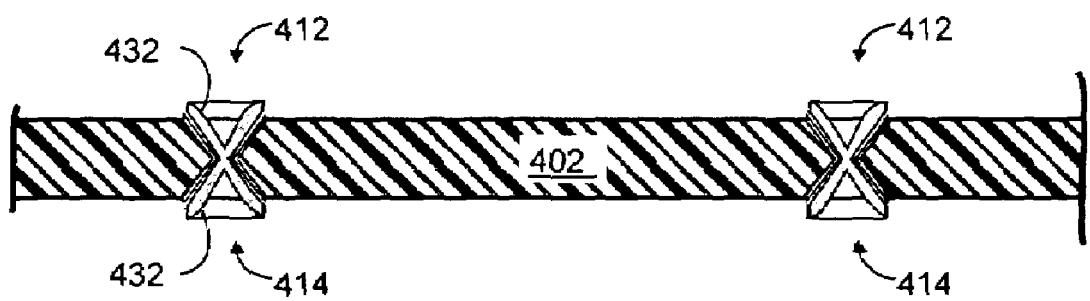

FIG. 4F illustrates a next (final) step wherein the masking layer 430 is removed (such as by rinsing off), and the unplated part of the seed layers 418 and 420 are removed (such as by selective chemical etching), leaving the conductive material 432 within and bridging the two pits 412 and 414, thereby forming a conductive via through the substrate 402. This provides electrical continuity between the pit 412 and the pit 414.

Figure 4G:
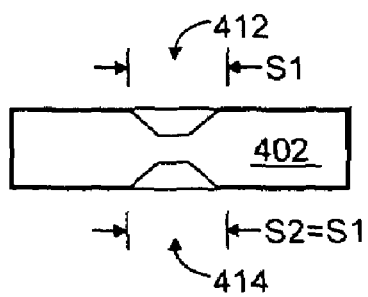
FIG. 4G is a schematic illustration of a step in the process described with respect to FIGS. 4A–4F, according to the invention.

FIG. 4G illustrates an interim temporal step in the process just described. When the pits 412 and 414 (see FIG. 4B) are first being etched, they "grow" towards one another. In the case that the openings 406 and 410 (see FIG. 4A) have the same cross-dimension (both are "S1"), the growing pits should be symmetrical with one another, one being the mirror image of the other, as illustrated.

Figure 4H:
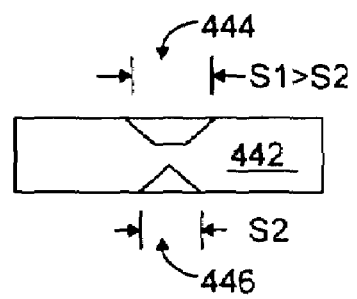
FIG. 4H is a schematic illustration of an alternate step in the process described with respect to FIGS. 4A–4F, according to the invention.

FIG. 4H illustrates an interim temporal step (compare FIG. 4G) in the process, in a case where the openings 406 and 410 (see FIG. 4A) do not have the same cross-dimension, for example the opening 406 has a larger cross dimension than the opening 410 (i.e., S1>S2). Here it can be observed that the two pits 444 and 446 (compare 412 and 414) grow into the substrate 442 (compare 402) at the same rate, but that the pit 446 has reached its apex and terminated its growth. The pit 444 will continue growing until etch self-terminates. The designer should select a thickness of substrate 402 and dimensions of openings 406 and 410 to permit this etching pattern, or another selected etching pattern.

Figure 4I:
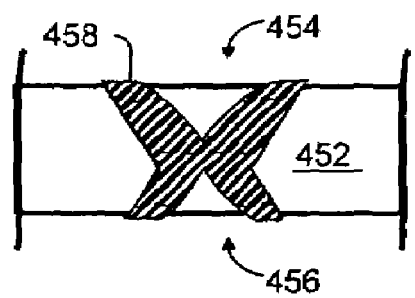
FIG. 4I is a side cross-sectional view of a socket substrate that has been made using the procedure set forth in FIG. 4H, according to the invention.

FIG. 4I illustrates a socket substrate 452 (compare 442) wherein the process has started with openings (compare 406 and 410) which do not have the same cross-dimension, as in the case discussed with respect to FIG. 4H. Here it can be observed that the pit 454 (compare 444) is wider and deeper than the pit 456 (compare 446). The conductive material 458 deposited onto the seed layers (not shown) in the pits 454 and 456 is illustrated.

In use, a free end of an elongate interconnection element (compare 223, FIG. 2F) can make contact with the conductive material 432 within the pit 412, and a conductive mass (compare 345, FIG. 3C) can make contact with the conductive material 432 within the pit 414.

Alternate Rear Connection Techniques

There have been described, for example in FIGS. 2F, 3C and 4E hereinabove, techniques for effecting connections through the socket substrate, to the back side thereof.

Figure 4J:
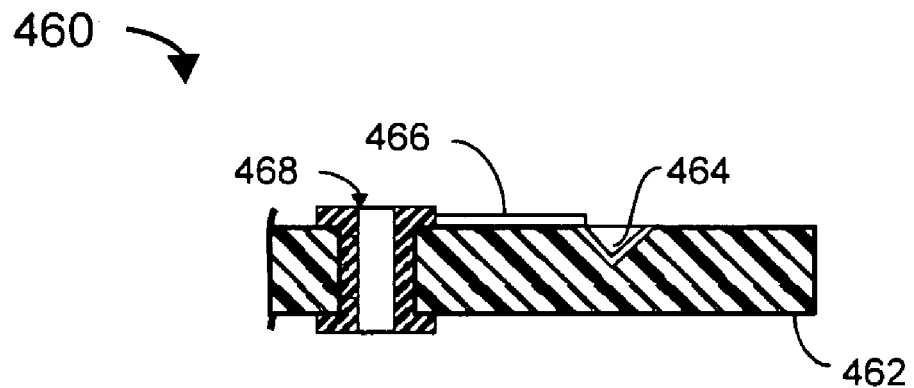
FIG. 4J is a side cross-sectional view of another socket substrate, according to the invention.

FIG. 4J illustrates an alternate structure 460. In this preferred embodiment for effecting connections through a socket substrate 462 from capture terminals 464 on the front side thereof through to the back side thereof. The terminals 464 are illustrated as being the pit-type terminals such as those (286 and 304) described with respect to FIG. 2D or 3A, respectively.

A conductive routing trace 466 extends between a terminal 464 and a conventional plated through-hole 468 extending through the socket substrate 462. In this manner, connections (e.g., to an interconnection substrate or the like) can be made to the back side of the socket substrate 462. Such traces can be used in conjunction with the plated through-holes discussed above. See, for example, FIG. 4I and use the illustrated structure in place of 468 in FIG. 4J.

Figure 4K:
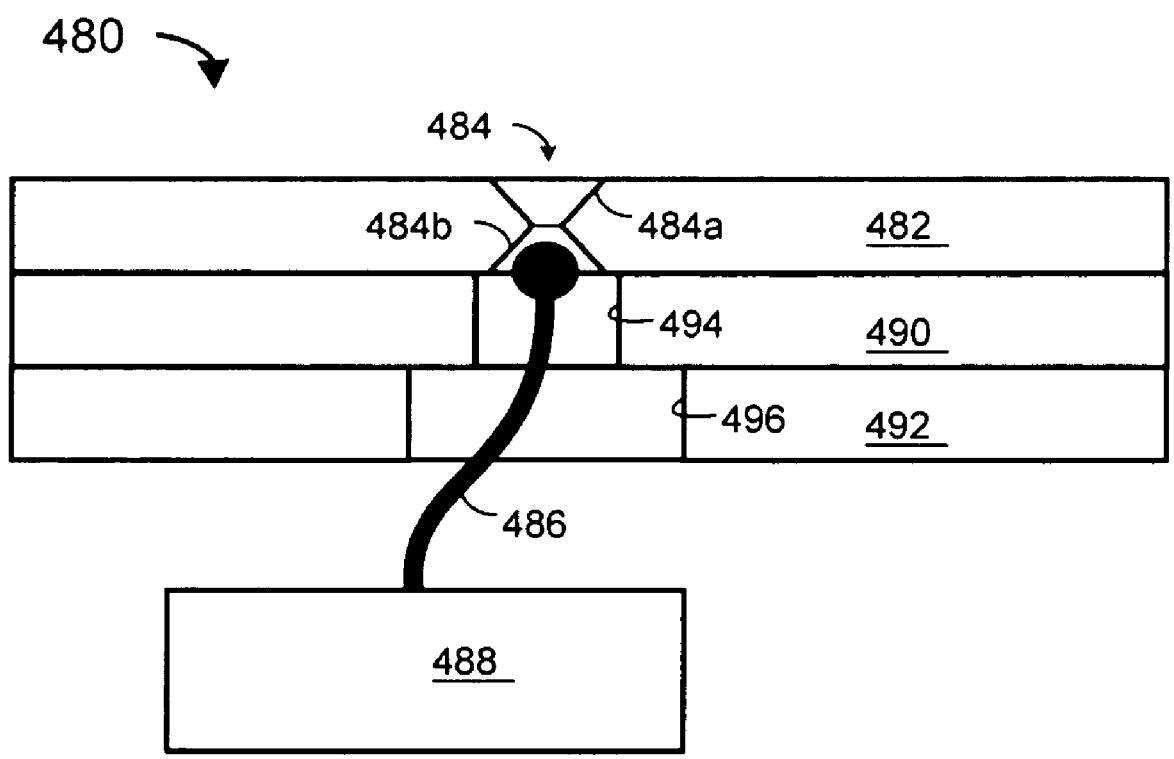
FIG. 4K is a side cross-sectional view illustrating supporting and connecting to a socket substrate, according to the invention.

FIG. 4K illustrates another alternate technique 480 for effecting connections through a socket substrate 482 (compare 342 in FIG. 3C) using double-pyramid type through-holes 484 (compare 344) having metallization. The socket substrate 482 suitably comprises a silicon wafer. A connection is made to the lower portion 484b of the through-hole 484 with an end of an elongate interconnection element 486 extending from an interconnection substrate 488 (compare 346) in much the same manner as shown in FIG. 2F. In one preferred embodiment, this interconnection element 486 may be attached to an interposer. The socket substrate 482 is reinforced by and supported, but not necessarily electrically connected to, one or more support substrates. These preferably are electrically isolated and may be made of insulating material. Silicon or ceramic are particularly useful. In this example, two support substrates 490 and 492 are illustrated.

A first support substrate 490 is disposed immediately adjacent the socket substrate 482 and is provided with a hole 494 extending therethrough in alignment (e.g., coaxial) with the through-hole 484. The hole 494 has a cross-dimension which is larger than the cross-dimension of the through-hole 484 where it enters the back side of the socket substrate 482.

The socket substrate 482 is preferably adhered to the support substrate 490 with a suitable adhesive, such as cyanoacrylate.

A second support substrate 492 is disposed adjacent the first support substrate 490 and is provided with a hole 496 extending therethrough in alignment (e.g., coaxial) with the hole 494. The hole 496 has a cross-dimension which is larger than the cross-dimension of the hole 494. The first support substrate 490 is preferably adhered to the second support substrate 492 with a suitable adhesive, such as cyanoacrylate. The dimensions of holes 494 and 496 are preferably sequentially larger, forming a tapered opening. However, these dimensions are not critical so long as the desired interconnection element can make electrical contact with through-hole 484. For example, it may be desirable to have a narrow hole 496 in order to provide some additional strength to the assembly or to assist in positioning the elongate connection element 486.

In this manner, electrical connections can be effected from the interconnection substrate 488 to the portion 484a of the through-hole 484 comprising the capture pad of the socket substrate 482.

Burn-In Fixture (Assembly) for a Single Die

There have been described, hereinabove, a number of socket substrates suitable for making electrical connections to elongate contact elements on electronic components such as semiconductor devices. An exemplary application for such a socket substrate is now described.

Figure 5:
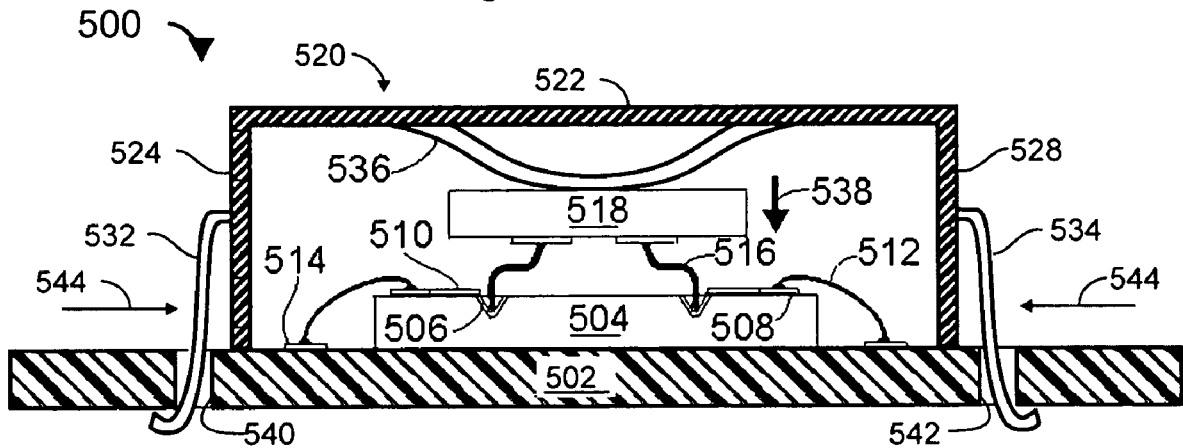
FIG. 5 is a side cross-sectional view of a fixture assembly for socketably receiving a springed semiconductor device with a socket substrate, according to the invention.
Figure 5A:
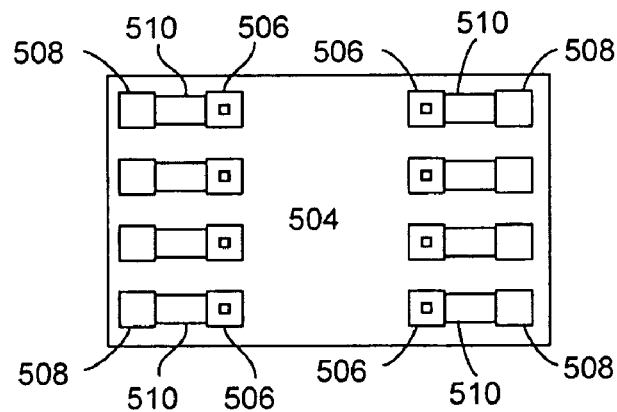
FIG. 5A is a top plan view of the socket substrate of FIG. 5, according to the invention.

FIG. 5 illustrates an assembly 500 comprising an interconnection and support substrate 502 (compare 330 in FIG. 3B) and a socket substrate 504 (compare 322) of the type described hereinabove with respect to FIG. 3B. The socket substrate 504 has capture pads which are terminals 506 (compare 324) connected to bond-out terminals 508 (compare 328) by conductive traces 510 (compare 326). The bond-out terminals 508 are connected by bond wires 512 (compare 334) to terminals 514 (compare 332) on the interconnection substrate 502. Terminals 514 can be connected to other devices using techniques well known in the art. One representative method is to provide conductive traces on the surface of the support substrate. Referring to the top plan view of FIG. 5A, the socket substrate 504 is suitably provided with a plurality of terminals 506. By way of example, eight are shown.

In use, the terminals 506 receive ends of a corresponding plurality of interconnection elements 516 (compare 204), such as spring contact elements, extending from a surface of an electronic component 518 (compare 202), such as a semiconductor device.

Figure 5B:
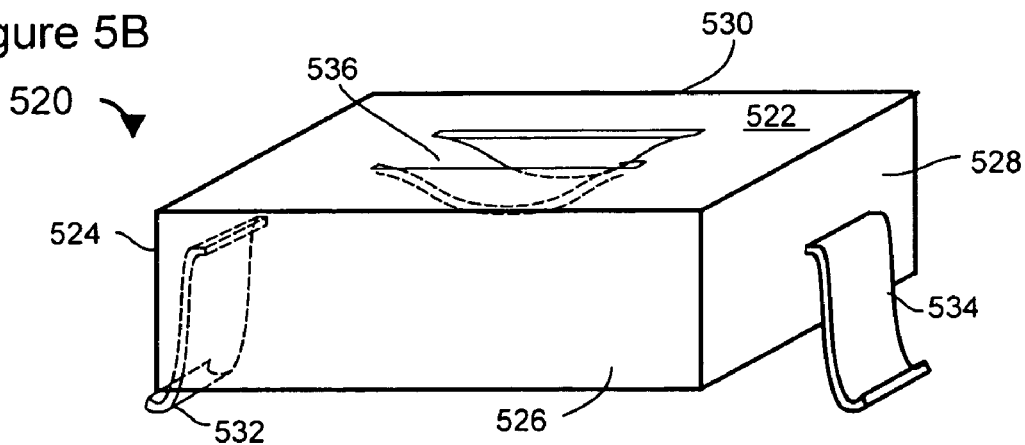
FIG. 5B is a perspective view of a housing component for the assembly described with respect to FIG. 5, according to the invention.

The assembly 500 further comprises a housing (can) 520 in the general form of an open box. Referring to FIG. 5B, the housing 520 has a top surface 522 and four sidewalls 524, 526, 528 and 530 (two of which, the sidewalls 524 and 528, are visible in the cross-sectional view of FIG. 5). The bottom of the housing 520 is open. Opposing sidewalls 524 and 528 are each provided with tab-like legs 532 and 534, respectively, extending therefrom past the bottom of the housing 520. The top surface 522 of the housing 520 is provided with bowed portion (section) 536 which, in use, presses downward, as illustrated by the arrow 538 in FIG. 5, against the back surface of the electronic component 518 to hold the ends of the interconnection elements 516 in contact with the terminals 506. To hold the housing 520 in place on the interconnection substrate 502, the ends of the legs 532 and 534 are inserted through corresponding holes 540 and 542, respectively, in the interconnection substrate 502. Referring to FIG. 5, end portions of the legs 532 and 534 extend past the bottom surface of the interconnection substrate 502 and are shaped (curled, bent) to be captured on the bottom surface of the interconnection substrate 502 and to retain the housing 520 in place on the interconnection substrate 502.

The assembly 500 is useful for performing burn-in on electronic components such as semiconductor devices, as follows. The device 518 is placed on the socket substrate 502 so that the ends of the interconnection elements 516 engage the terminals 506 of the socket substrate 504. The housing 520 is disposed over the semiconductor device 518 so that the bowed portion 536 presses against the back surface of the semiconductor device 518 and so that the tabs 532 and 534 extend through the corresponding holes 540 and 542 in the interconnection substrate 502. Power can be supplied to the terminals 508 of the interconnection substrate 502 to power-up and burn-in the semiconductor device 518. The housing 520 may be removed by squeezing the legs 532 and 534 inward (towards one another), as illustrated by the arrows 544, and the semiconductor device 518 can be removed. Another installed in its place and the process is repeated (the housing is reinstalled on the interconnection substrate to burn-in the subsequent component).

Another Fixture for a Single Component

Figure 5C:
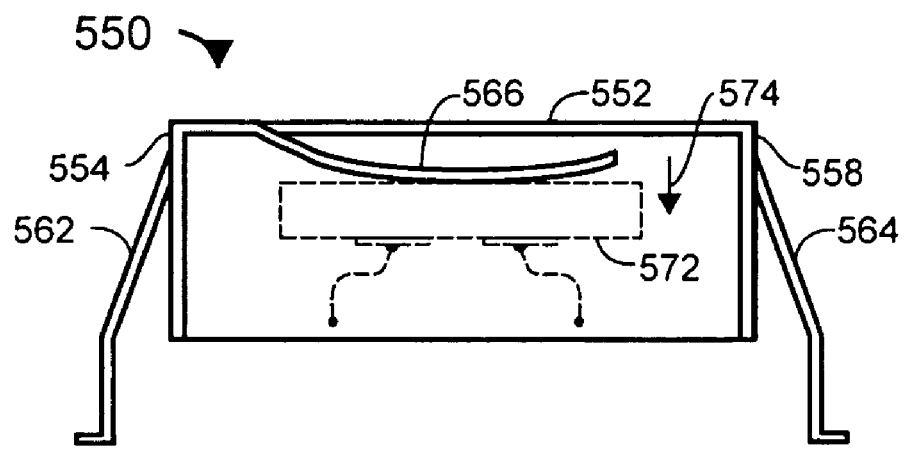
FIG. 5C is a side cross-sectional view of another fixture assembly for socketably receiving a springed semiconductor device with a socket substrate, according to the invention.
Figure 5D:
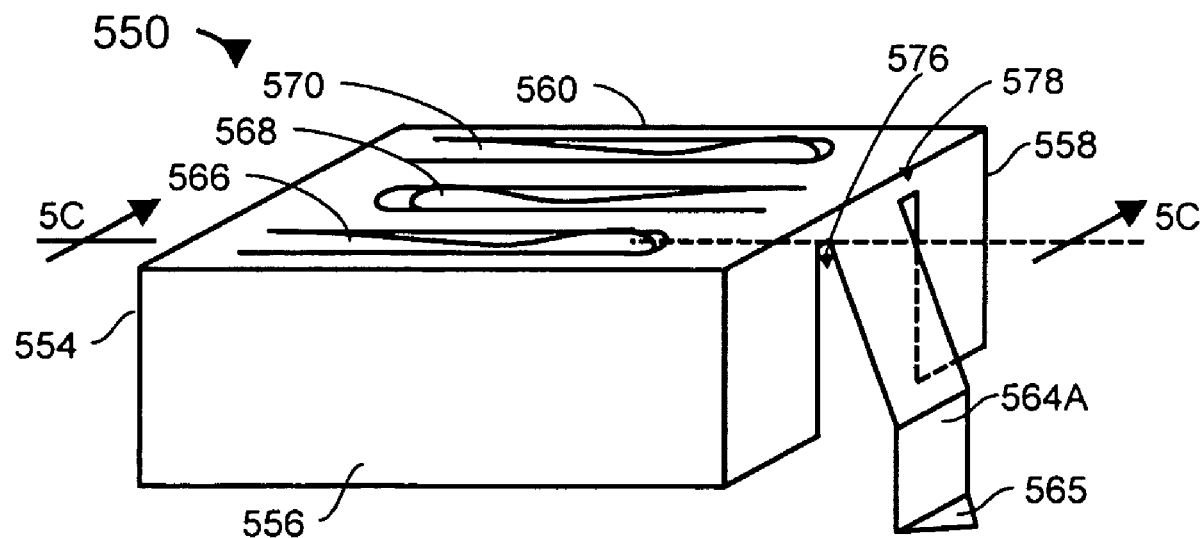
FIG. 5D is a perspective view of the housing component for the assembly described with respect to FIG. 5C, according to the invention.

FIGS. 5C and 5D illustrate another preferred embodiment. Housing 550 is similar to the housing 520 described hereinabove. The housing 550 is in the general form of an open box. As best viewed in FIG. 5D (compare FIG. 5B), the housing 550 has a top surface 552 (compare 522) and four sidewalls 554, 556, 558 and 560 (compare 524, 526, 528, 530), two of which, the sidewalls 524 and 528, are visible in the cross-sectional view of FIG. 5C). The bottom of the housing 550 is open. Two opposite sidewalls 554 and 558 are each provided with tab-like legs 562 and 564 (compare 532 and 534), respectively, extending therefrom and past the bottom of the housing 550.

The top surface 552 of the housing 550 is punched, or the like, to have three elongate portions 566, 568 and 570. Two of these elongate portions 566 and 570 extend parallel to and spaced apart from one another, from adjacent a one edge of the top surface 552 towards an opposite edge of the top surface. The third of these elongate portions 568 extends from adjacent the opposite edge of the top surface towards the one edge of the top surface, parallel to and between the two elongate portions 566 and 570. Each of the elongate portions 566, 568 and 570 is shaped as a cantilevered "bow" (compare 536) capable of pressing down upon the back surface of the electronic component 572 (compare 518) as indicated by the arrow 574 (compare 538).

The legs 562 and 564 of the housing 550 are suitably formed in the following manner. Referring to FIG. 5D, a leg 564 is formed in a sidewall 558 of the housing by two spaced-apart parallel notches 576 and 578 extending from the bottom edge of the sidewall 558 substantially to the top edge of the sidewall 558. The leg 564 can then be bent outward from the sidewall, then an end portion 564A of the leg can be bent to extend parallel to the sidewall. This is normal (90°) to an interconnection substrate (compare 502) with a hole (compare 542) to receive the end of the elongate leg 564. And, as in the previous example, the end portions of the legs 562 and 564 can be shaped (curled, bent) so as to be captured on the bottom surface of the interconnection substrate (502), and retain the housing 550 in place on the interconnection substrate (502).

In a useful variant of the contact architecture, contact terminals are provided directly on a support substrate. Referring to FIG. 5 as an example, terminals 506 can be formed directly in the support substrate 502. In a preferred embodiment, such terminals 506 are flat contact adjacent to the surface of the support substrate. Support substrate 502 can be an organic material such as a printed circuit board. In this embodiment, there is no need for wirebonds 512, and terminals 506 can be connected directly to other circuitry as desired.

In a useful variant of the enclosing housing, a simple flat unit is fitted with legs at four corners, much like a typical table, with the legs extending toward the support substrate. The support substrate in turn has corresponding holes into which the legs can be inserted. The legs can include a bendable, offset, or expanding locking feature to hold the flat unit in place to secure the semiconductor device 518 in contact with terminals 506. In a particularly preferred embodiment, a housing is fitted with legs of thermoplastic material. The semiconductor device 518 is aligned with terminals 506 and the housing is positioned to exert some pressure on the semiconductor device, with the legs passing through holes in the support substrate. Each leg of the housing is then heated ("hot staked") to melt the material in a manner to prevent the leg from moving back through the hole in the substrate.

Another Arrangement for a Single Die

There have been described, hereinabove, two fixtures, both involving housings (520, 550) for reversibly connecting an electronic component (518, 572) to a socket substrate for the purpose of exercising (burning-in or testing) the electronic component. Method have also been described for effecting connections between the socket substrate and an external device or system.

Figure 6:
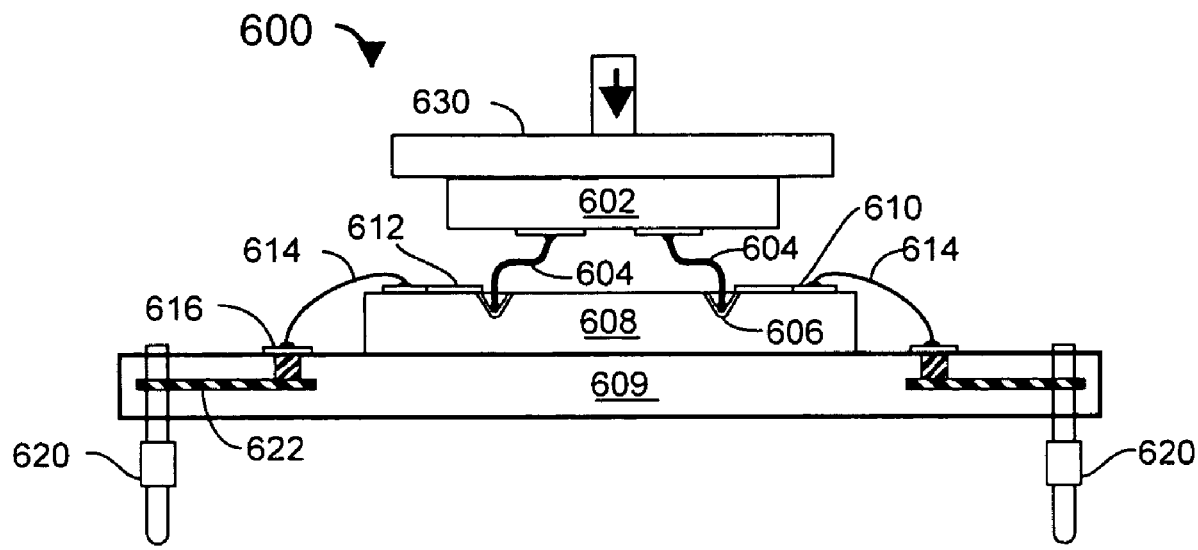
FIG. 6 is a side cross-sectional view, partially schematic, of a fixture for socketably receiving a springed semiconductor device with a socket substrate, according to the invention.

FIG. 6 illustrates an alternate technique 600 for holding an electronic component 602 having elongate interconnection elements 604 extending therefrom against terminals of a socket substrate 608. In this example, the socket substrate 608 is of the type described hereinabove with respect to FIG. 3B. The socket substrate 608 (compare 322) has pit-type terminals 606 (compare 324) connected to bond-out terminals 610 (compare 328) by conductive traces 612 (compare 326). The bond-out terminals 610 are connected by bond wires 614 (compare 334) to terminals 616 (compare 332) on the interconnection substrate 609.

In this example, rather than having traces (compare 339) and terminals (compare 336) on the surface of the interconnection substrate 608 and connections (compare 336) being made to the top side of the interconnection substrate 609, the interconnection substrate 609 is provided with a set of "pogo pins" 620 extending from a bottom surface thereof and connected by internal conductive traces 622 to the terminals 616.

In this example, rather than having a housing (520, 550) holding the electronic component (518, 572) against the socket substrate, the electronic component 602 is held against the socket substrate 608 by a test head (or vacuum chuck) 630.

Figure 6A:
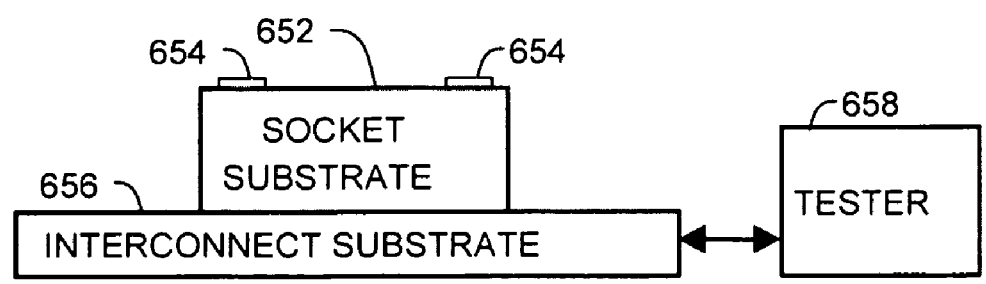
FIG. 6A is a schematic illustrating socketably receiving a springed semiconductor device and making connections to an external device, according to the invention.

FIG. 6A illustrates a technique 650, representative of any and all of the aforementioned techniques for socketably receiving an electronic component for performing burn-in or test. A socket substrate 652 has a plurality of "capture" terminals (pits, pads, etc.) 604 on a surface thereof and is mounted and connected in any suitable manner (bond wires, conductive masses, etc.) to an interconnection substrate 656 which, in turn, is connected in any suitable manner (e.g., edge connectors, pogo pins, etc.) to an external test device or system ("TESTER") 658.

A Fixture for Multiple Dies

The concept of socketably receiving a single springed semiconductor device can readily be extended to a plurality of springed semiconductor devices, as follows.

Figure 7:
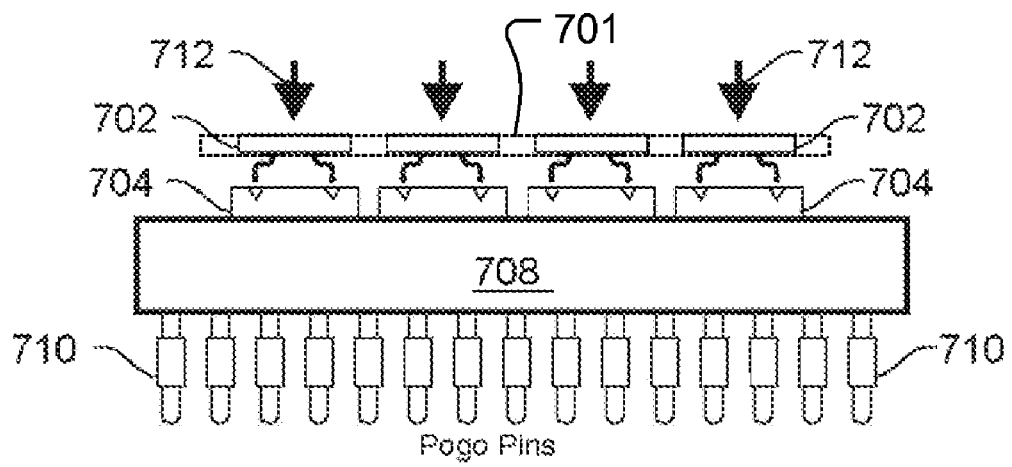
FIG. 7 is a side cross-sectional view illustrating socketably receiving a number of springed semiconductor device with a number of socket substrates, according to the invention.
Figure 7A:
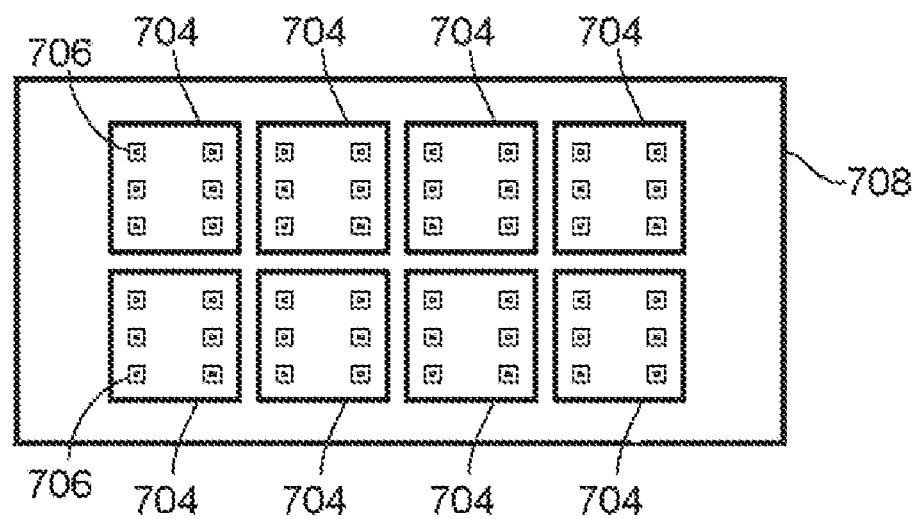
FIG. 7A is a top plan view of the socket substrates of FIG. 7 residing on an interconnection substrate, according to the invention.

FIGS. 7 and 7A illustrates an arrangement 700 for simultaneously exercising a plurality (four shown in FIG. 7) of electronic components 702 which are springed semiconductor devices. Each of the springed semiconductor devices 702 (compare 518) has elongate interconnection elements which are spring contact elements extending from a surface thereof. A corresponding plurality (eight shown in FIG. 7A) of socket substrates 704 (compare 504) have capture pads 706 (six shown, per socket substrate) which are suitably pit-terminals (compare 506) for socketably receiving the free ends of the elongate interconnection elements, in any of the manners described hereinabove. The socket substrates 704 are all suitably mounted to and electrically connected to a common support/interconnection substrate 708 (compare 502) in any of the manners described hereinabove. No particular connections are illustrated, for illustrative clarity. Exemplary connections from the interconnection substrate 708 to the "outside world" are illustrated in this example as a plurality of pogo pins 710. The springed semiconductor devices 702 are held against the corresponding socket substrate 704 in any suitable manner, such as has been described hereinabove (e.g., housings 520 and 550, test head 630, or the like), as is illustrated by the arrows 712. In this manner, a number (such as eight) of individual springed semiconductor devices 702 can reversibly be connected to by an external device or system (compare 658). As alternatively shown in FIG. 7, the springed semiconductor devices 702 can alternatively be unsingulated dies of a semiconductor wafer 701, which is depicted in dashed lines in FIG. 7 indicating that wafer 701 is an alternative configuration.

Figure 7B:
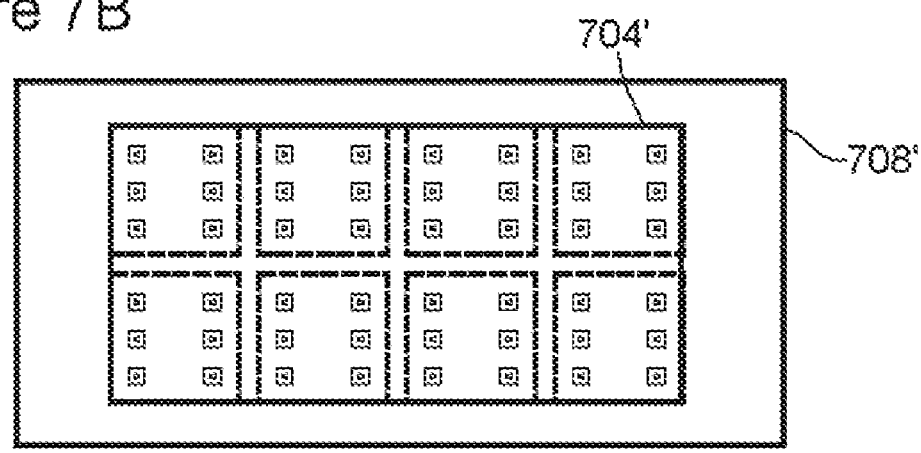
FIG. 7B is a top plan view of a single large socket substrate for socketably receiving a number of springed semiconductor dies, residing on an interconnection substrate, according to the invention.

As shown in FIG. 7B, the concept of exercising a group of single dies (electronic components) can be implemented with a single socket substrate 704' supported by and connected to an interconnection substrate 708' (compare 708). In this figure, eight socket areas on the socket substrate 704' are shown separated by dashed lines, and correspond to the eight discrete socket substrates 704 illustrated in FIG. 7A.

Wafer-Level System

The concepts of socketably receiving a single springed semiconductor device and of socketably receiving a number of springed semiconductor devices have been described hereinabove. The concepts can be extended to exercising an entire wafer of springed semiconductor devices, as follows.

Figure 8:
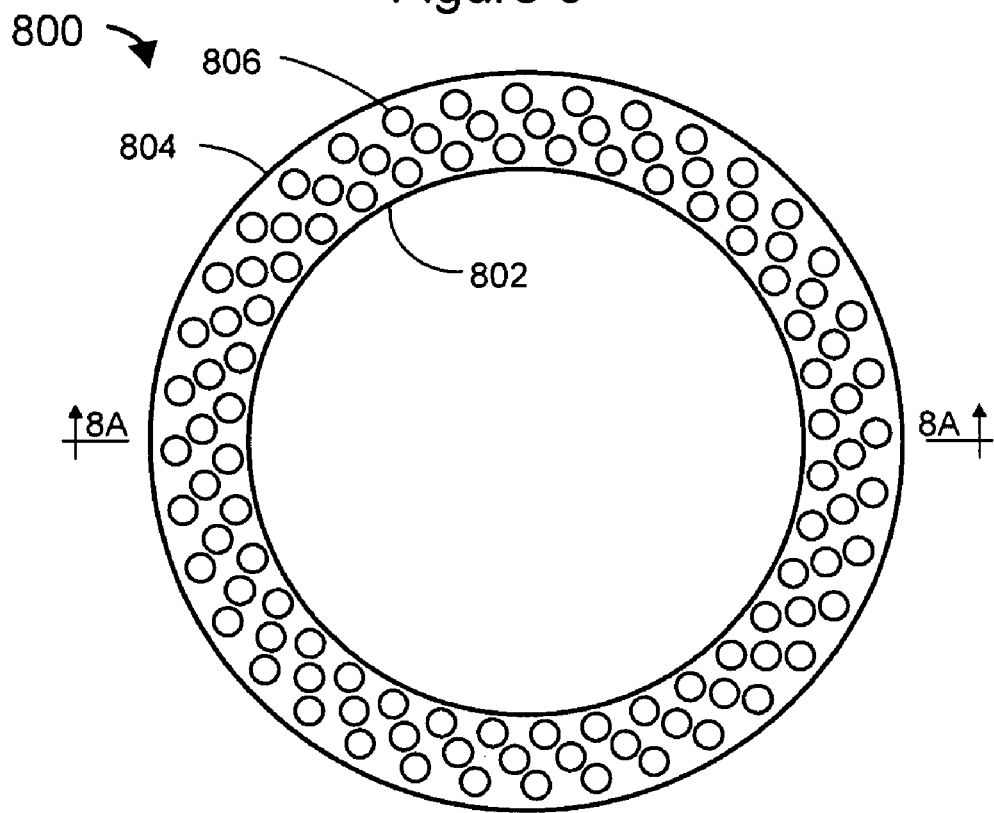
FIG. 8 is a plan view of an assembly of an interconnection substrate having a single very large socket substrate for socketably receiving a plurality of springed semiconductor devices resident on a semiconductor wafer, according to the invention.

FIG. 8 illustrates a system 800 for testing an entire wafer (WUT) 802 (compare 702) having springed semiconductor devices. A single socket substrate, or combination of socket substrate and interconnection substrate, having appropriate capture pads is sized overall and formed with capture pads (terminals, not shown) to receive free ends of interconnection elements extending from, in this case, all of the semiconductor devices on the WUT 802. This can be done in various ways.

A first way to do this is to populate a single large interconnection substrate (compare 708) with an appropriate number of individual socket substrates (compare 704) so that each semiconductor device on the WUT 802 has a socket substrate associated with it and receiving its interconnection elements. This is much like the system shown in FIG. 7, but on a larger scale, and except that the semiconductor devices (702) are resident on the WUT 802 (i.e., not singulated from the WUT).

Another way to do this is to populate a single large interconnection substrate (compare 708) with an appropriate smaller number of socket substrates (compare 704'), each of which is capable of receiving the interconnection elements from a number (e.g., eight) of semiconductor dies (compare 702) resident on the WUT 802. This is much like the system shown in FIG. 7A, but on a larger scale.

Figure 8A:
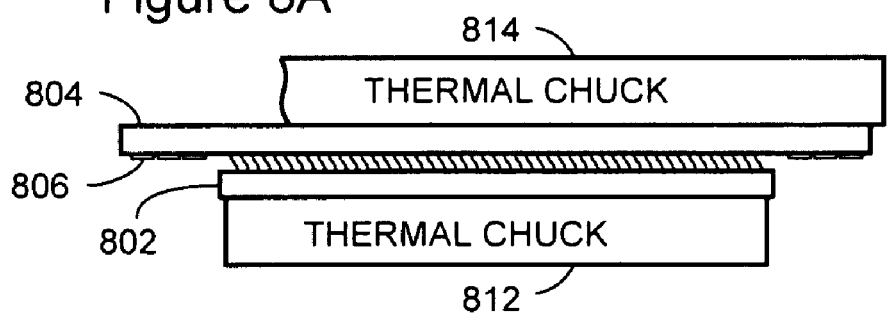
FIG. 8A is a side cross-section view of the assembly of FIG. 8, according to the invention.

Yet another way to do this is shown in FIG. 8A. In this case, a single socket substrate 804, which may be formed from another silicon wafer, is larger (e.g., in diameter) than the WUT 802. A peripheral region of the socket substrate 804 which extends beyond the periphery of the WUT 802 is populated with pads 806 or the like, for effecting connections to external systems and devices, in any of the manners described hereinabove. In use (i.e., when operating the semiconductor devices on the WUT), unwanted heat can be moved away from the WUT 802 and the socket substrate 804 by thermal chucks 812 and 814, respectively.

Figure 8B:
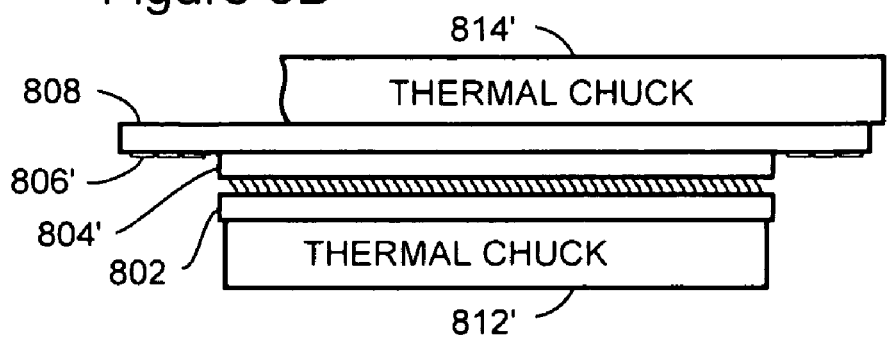
FIG. 8B is a side cross-section view of an alternate implementation of the assembly of FIG. 8, according to the invention.

A still further way to do this is shown in FIG. 8B. In this case, a single socket substrate 804', which may be formed from another silicon wafer, is approximately the same size (e.g., in diameter) as the WUT 802, and is mounted and connected to an interconnection substrate 808 which is larger than either the socket substrate 804' or the WUT 802. A peripheral region of the interconnection substrate 808 which extends beyond the periphery of the socket substrate 804' is populated with pads 806' or the like, for effecting connections to external systems and devices, in any of the manners described hereinabove. In use (i.e., when operating the semiconductor devices on the WUT), unwanted heat can be moved away from the WUT 802 and the socket substrate 804' by thermal chucks 812' and 814', respectively.

Figure 8C:
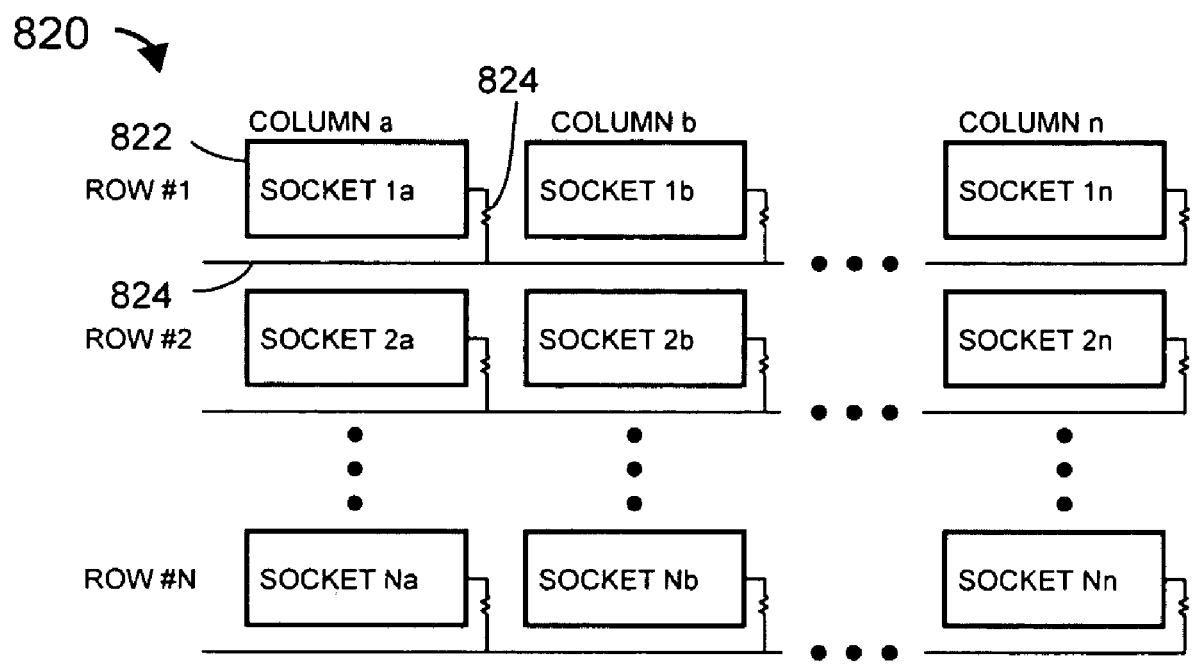
FIG. 8C is a schematic illustrating connecting to a plurality of socket sites on a very large substrate for socketably receiving a plurality of springed semiconductor devices resident on a semiconductor wafer, according to the invention.

FIG. 8C illustrates schematically an exemplary scheme 820 for arranging and interconnecting the various sockets (compare 704') resident on the socket substrate, whether the socket substrate is the socket substrate 804 of FIG. 8A or is the socket substrate 804' of FIG. 8B. A plurality of sockets 822 are arranged in columns (numbered from "a" to "n") and rows (numbered from "1" to "N"). Each socket 822 corresponds to a one of the semiconductor devices resident on the wafer under test (WUT) 802. For purposes of simply burning-in the plurality of semiconductor devices resident on the WUT 802, it is generally adequate that each socket have terminals (e.g., pit terminals) corresponding to the interconnections on the springed semiconductor devices which need power to burn-in the semiconductor device. In other words, it is generally not necessary to make connections with all of the interconnection elements of the semiconductor devices to burn them in. As shown in the figure, power can be delivered to the various sockets 822 via a reduced number of common lines 824, each line connected to a corresponding socket via a resistor 826. In this manner, should one of the semiconductor devices resident on the WUT 802 become shorted out, it would be isolated by the resistors from the remaining ones of the semiconductor devices being burned in.

Converting a Probe Card

A probe card comprises an interconnection substrate and elongate spring contact elements extending directly or indirectly therefrom and arranged to make contact with terminals of semiconductor devices resident on a semiconductor wafer. A tester is connected to the probe card to exercise the semiconductor devices on the wafer.

Commonly-owned, copending U.S. patent application Ser. No. 08/554,902 filed 09 Nov. 95 (status: pending), and its counterpart PCT Patent Application No. US95/14844 filed 13 Nov. 95 (status: pending. published as WO96/15458 23 May 96) disclose an exemplary probe card.

Figure 9:
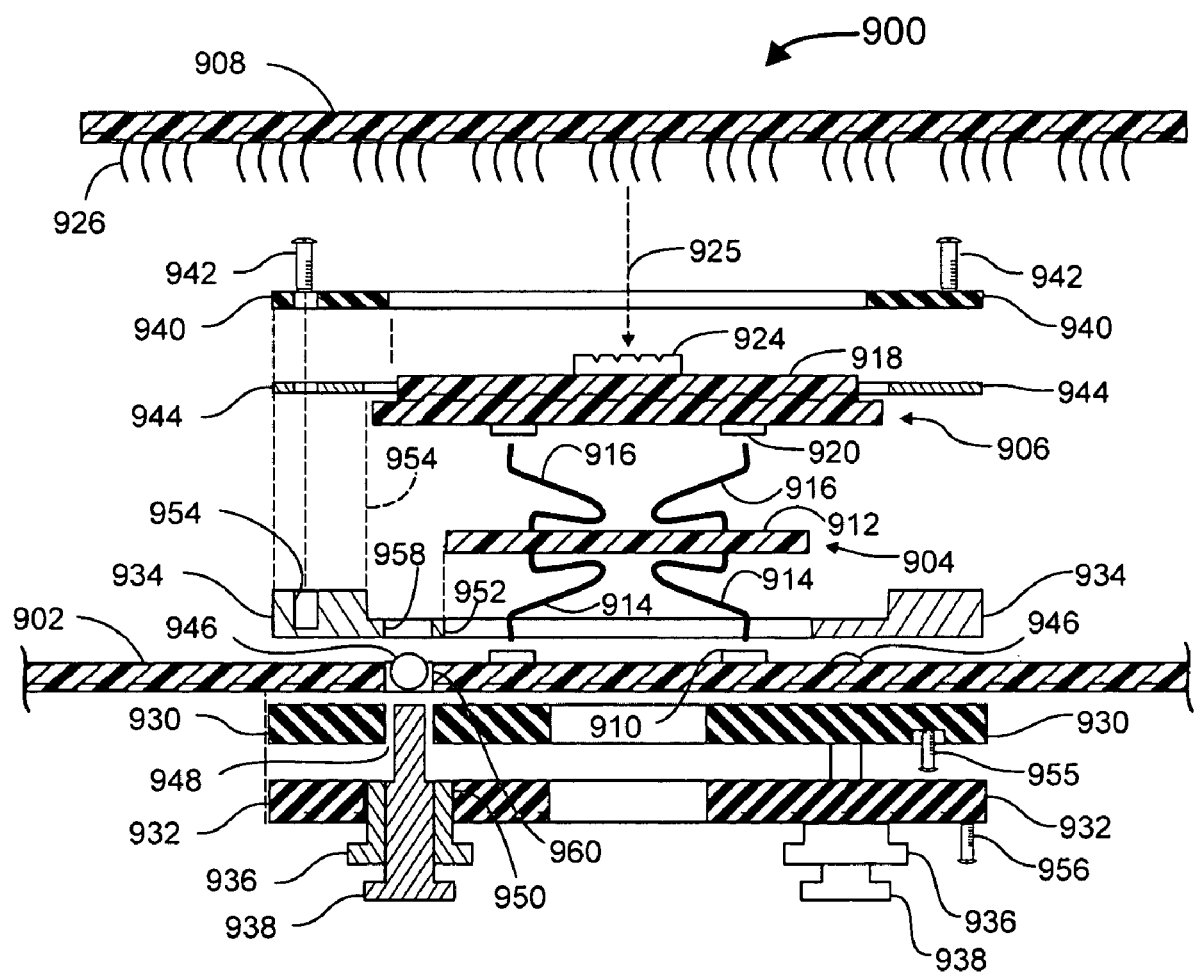
FIG. 9 is a side cross-sectional view of an assembly for probing springed semiconductor devices, according to the invention.

FIG. 9 herein is comparable to FIG. 5 of these copending patent applications. Elements numbered 5xx in those applications are generally numbered 9xx herein.

FIG. 9 illustrates a probe card assembly 900 which includes as its major functional components a probe card 902, an interposer 904, and an interconnection substrate 906 which may be a space transformer, which is suitable in use for making reversible interconnections to elongate interconnection elements 926 extending from semiconductor devices resident on a semiconductor wafer 908, which may be (but is not required to be) an unsingulated wafer.

Whereas the space transformer (518) of the copending applications is provided with a plurality of resilient interconnection elements (524, "probes", "probe elements") arranged to make pressure connections with corresponding bond pads (526) on the semiconductor devices resident on the semiconductor wafer (508), in the probe card assembly 900 of the present invention, a socket substrate 924 of any of the types of socket substrates described hereinabove is suitably mounted on and connected to the interconnection substrate 918 in any of the manners described hereinabove.

In use, the wafer 908 is urged (as illustrated by the arrow 925) against the probe card assembly 900 (or vice versa) so that the ends of the elongate interconnection elements 926 extending from one or more (including all of) the semiconductor devices on the semiconductor wafer 908 make contact with the terminals (e.g., pit terminals) on the socket substrate 924. In the case of the interconnection elements of fewer than all of the semiconductor devices being contacted, after testing the ones that are contacted, the wafer 908 is repositioned so that others of the semiconductor devices are contacted (repeated "touchdowns") and can be tested.

A benefit that readily can be realized by using the probe card assembly 900 of the present invention is that the metallurgy of the capture terminals of the socket substrate 924 is readily controlled to optimize contact with the ends of the interconnection elements 926, for example gold-to-gold contact and limiting scrubbing.

In the interest of completeness, a brief description of the remaining elements of the probe card assembly 900 follows.

The probe card 902 is generally a conventional circuit board substrate having a plurality (two of many shown) of contact areas (terminals) 910 disposed on the top (as viewed) surface thereof. The interposer 904 includes a substrate 912. A plurality (two of many shown) of resilient interconnection elements 914 are mounted (by their proximal ends) to and extend downward (as viewed) from the bottom (as viewed) surface of the substrate 912, and a corresponding plurality (two of many shown) of resilient interconnection elements 916 are mounted (by their proximal ends) to and extend upward (as viewed) from the top (as viewed) surface of the substrate 912. The interconnection substrate 906 comprises a suitable circuitized substrate 918, such as a multi-layer ceramic substrate having a plurality (two of many shown) of terminals (contact areas, pads) 920 disposed on the lower (as viewed) surface thereof and a plurality (two of many shown) of terminals (contact areas, pads) 922 disposed on the upper (as viewed) surface thereof.

The probe card assembly 900 includes the following major components for stacking the interposer 906 and the interconnection substrate 906 onto the probe card 902:

a rear mounting plate 930 made of a rigid material such as stainless steel, an actuator mounting plate 932 made of a rigid material such as stainless steel, a front mounting plate 934 made of a rigid material such as stainless steel, a plurality (two of many shown, three is preferred) of differential screws including an outer differential screw element 936 and an inner differential screw element 938, a mounting ring 940 which is preferably made of a springy material such as phosphor bronze and which has a pattern of springy tabs (not shown) extending therefrom, a plurality (two of many shown) of screws 942 for holding the mounting ring 938 to the front mounting plate 934 with the interconnection substrate 906 captured therebetween, optionally, a spacer ring 944 disposed between the mounting ring 940 and the interconnection substrate 906 to accommodate manufacturing tolerances, and a plurality (two of many shown) of pivot spheres 946 disposed atop (as viewed) the differential screws (e.g., atop the inner differential screw element 938).

The rear mounting plate 930 is a metal plate or ring (shown as a ring) disposed on the bottom (as shown) surface of the probe card 902. A plurality (one of many shown) of holes 948 extend through the rear mounting plate.

The actuator mounting plate 932 is a metal plate or ring (shown as a ring) disposed on the bottom (as shown) surface of the rear mounting plate 930. A plurality (one of many shown) of holes 950 extend through the actuator mounting plate. In use, the actuator mounting plate 932 is affixed to the rear mounting plate 930 in any suitable manner, such as with screws (omitted from the figure for illustrative clarity).

The front mounting plate 934 is a rigid, preferably metal ring. In use, the front mounting plate 934 is affixed to the rear mounting plate 930 in any suitable manner, such as with screws (omitted from the figure for illustrative clarity) extending through corresponding holes (omitted from the figure for illustrative clarity) through the probe card 902, thereby capturing the probe card 902 securely between the front mounting plate 934 and rear mounting plate 930.

The front mounting plate 934 has a flat bottom (as viewed) surface disposed against the top (as viewed) surface of the probe card 902. The front mounting plate 934 has a large central opening therethrough, defined by an inner edge 952 the thereof, which is sized to permit the plurality of contact terminals 910 of the probe card 902 to reside within the central opening of the front mounting plate 934, as shown.

As mentioned, the front mounting plate 934 is a ring-like structure having a flat bottom (as viewed) surface. The top (as viewed) surface of the front mounting plate 934 is stepped, the front mounting plate being thicker (vertical extent, as viewed) in an outer region thereof than in an inner region thereof. The step, or shoulder is located at the position of the dashed line (labeled 954), and is sized to permit the interconnection substrate 906 to clear the outer region of the front mounting plate and rest upon the inner region of the front mounting plate 934 (although, as will be seen, the interconnection substrate 906 actually rests upon the pivot spheres 946).

A plurality (one of many shown) of holes 955 extend into the outer region of the front mounting plate 934 from the top (as viewed) surface thereof at least partially through the front mounting plate 934 (these holes are shown extending only partially through the front mounting plate 934 in the figure) which, as will be seen, receive the ends of a corresponding plurality of the screws 942. To this end, the holes 955 are threaded holes. This permits the interconnection substrate 906 to be secured to the front mounting plate by the mounting ring 940, hence urged against the probe card 902.

A plurality (one of many shown) of holes 958 extend completely through the thinner, inner region of the front mounting plate 934, and are aligned with a plurality (one of many shown) of corresponding holes 960 extending through the probe card 902 which, in turn, are aligned with the holes 948 in the rear mounting plate and the holes 950 in the actuator mounting plate 938.

The pivot spheres 946 are loosely disposed within the aligned holes 958 and 960, at the top (as viewed) end of the inner differential screw elements 938. The outer differential screw elements 936 thread into the (threaded) holes 950 of the actuator mounting plate 932, and the inner differential screw elements 938 thread into a threaded bore of the outer differential screw elements 936. In this manner, very fine adjustments can be made in the positions of the individual pivot spheres 946. For example, the outer differential screw elements 936 have an external thread of 72 threads-per-inch, and the inner differential screw elements 938 have an external thread of 80 threads-per inch. This permits facile and precise adjustment of the planarity of the interconnection substrate 906 vis-à-vis the probe card 902. Hence, the positions of the socket substrate 924 can be changed, without changing the orientation of the probe card 902. The interposer 904 ensures that electrical connections are maintained between the interconnection substrate 906 and the probe card 902 throughout the interconnection substrate's range of adjustment, by virtue of the resilient or compliant contact structures disposed on the two surfaces of the interposer.

The probe card assembly 900 is simply assembled by placing the interposer 904 within the opening 952 of the front mounting plate 934 so that the tips of the interconnection elements 914 contact the contact terminals 910 of the probe card 902, placing the interconnection substrate 906 on top of the interposer 904 so that the tips of the interconnection elements 916 contact the contact pads 920 of the interconnection substrate 906, optionally placing a spacer 944 atop the interconnection substrate 906, placing the mounting ring 940 over the spacer 944, and inserting the screws 942 through the mounting ring 940 through the spacer 944 and into the holes 955 of the front mounting plate 934, and mounting this "subassembly" to the probe card 902 by inserting screws (one shown partially as 955) through the rear mounting plate 930 and through the probe card 902 into threaded holes (not shown) in the bottom (as viewed) surface of the front mounting plate 934. The actuator mounting plate 938 can then be assembled (e.g., with screws, on of which is shown partially as 956) to the rear mounting plate 930, pivot spheres 960 dropped into the holes 950 of the actuator mounting plate 932, and the differential screw elements 936 and 938 inserted into the holes 950 of the actuator mounting plate 932.

An Overall Methodology

There have been described, hereinabove, techniques for contacting elongate interconnection elements extending from electronic components (e.g., springed semiconductor devices), including single semiconductor devices, groups of semiconductor devices, and an entire wafer of semiconductor devices, including exercising the semiconductor devices by performing burn-in and/or testing procedures. There is now described an overall process flow from fab-to-finished product.

Figure 10:
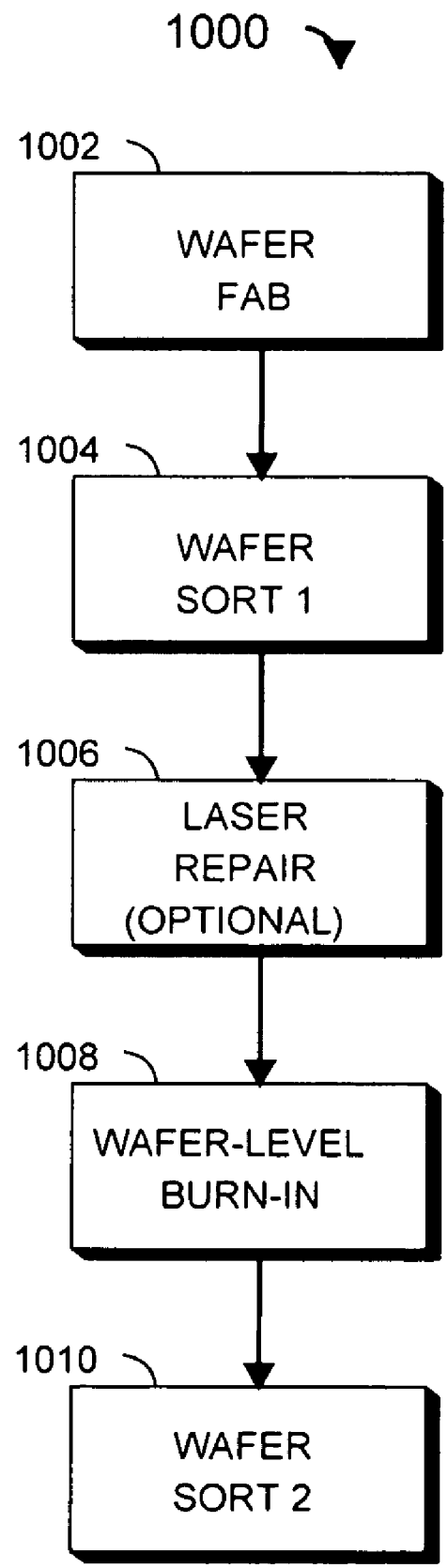
FIG. 10 is a flowchart of an overall process illustrating testing steps, according to the invention.

FIG. 10 illustrates a sequence of steps in an overall process 1000 for manufacturing semiconductor devices having resilient contact elements extending from a surface thereof.

In a first step ("WAFER FAB") 1002 of the process flow 1000, semiconductor devices are fabricated. These semiconductor devices are fabricated with elongate, resilient interconnection elements extending from a surface thereof, rather than simply with conventional bond pads, are termed "springed semiconductor devices". A plurality of springed semiconductor devices are resident on a semiconductor wafer.

In a next step ("WAFER SORT 1") 1004 of the process flow 1000, the wafers which have been fabricated to have springed semiconductor devices are sorted. This can use traditional probing, for example using a probe card of FIG. 9.

In a next step ("REPAIR") 1006 of the process flow 1000, problems may optionally be corrected, using techniques known in the art such as laser repair, anti-fuse techniques and the like.

In a next step ("WAFER-LEVEL BURN-IN") 1008 of the process flow 1000, the known good die on the wafer are burned-in, for example, by using the technique of FIG. 8 described hereinabove.

In a next step ("WAFER SORT 2") 1010 of the process flow 1000, the known good dies which have been burned-in in the step 1008 are functionally tested and sorted, for example, by using the technique described in FIG. 9 hereinabove.

In a final step (not shown), the burned-in, tested/sorted dies are singulated from the wafer, packaged (if desired), labeled, and inventoried or shipped for assembly into systems (not shown).

A general description of the device and method of using the present invention as well as several preferred embodiments of the present invention has been set forth above. One skilled in the art will recognize and be able to practice many changes in many aspects of the device and method described above, including variations which fall within the teachings of this invention. The spirit and scope of the invention should be limited only as set forth in the claims which follow.

What is claimed is:

1. An apparatus for exercising semiconductor devices, said apparatus comprising:
    a plurality of semiconductor devices, each comprising a plurality of elongate, spring connection elements;
    a support substrate comprising a plurality of terminals;
    test connection means for connecting said terminals to a test device;
    a plurality of socket substrates disposed on said support substrate, each said socket comprising a plurality of sockets and a plurality of traces, each said trace electrically connected to one of said sockets;
    means for electrically connecting ones of said traces with ones of said terminals; and
    means for pressing ones of said spring connection elements against ones of said sockets, wherein said spring connection elements generate spring counterforces and thereby form pressure connections with said sockets,
    wherein said plurality of semiconductor devices are dies of an unsingulated semiconductor wafer.

2. The apparatus of claim 1, wherein each socket substrate corresponds to one of said dies.

3. The apparatus of claim 1, wherein said support substrate is part of a probe card assembly.

4. The apparatus of claim 3, wherein said support substrate is electrically connected through an interposer to a probe card, and wherein said support substrate, said interposer, and said probe card compose said probe card assembly.

5. The apparatus of claim 1, wherein said test device provides test signals to test a functionality of said semiconductor devices.

6. The apparatus of claim 1, wherein said test device provides power to said semiconductor devices, and further comprising a temperature control device disposed to control a temperature of said semiconductor devices.

7. The apparatus of claim 6, wherein said temperature control device comprises:
- a first thermal chuck in thermal contact with said semiconductor devices; and
- a second thermal chuck in thermal contact with said socket substrates.

8. The apparatus of claim 1,
wherein said plurality of semiconductor devices are dies of an unsingulated semiconductor wafer
wherein said socket substrates are disposed in rows on said support substrate, and further comprising a plurality of power lines disposed on said support substrate, each said power line corresponding to one of said rows of socket substrates and supplying power to every socket substrate in said row.

9. The apparatus of claim 8, further comprising a plurality of isolation resistors, each said isolation resistor disposed between one of said power lines and one of said socket substrates.

10. The apparatus of claim 1, wherein said means for pressing comprises one of a test head or a vacuum chuck.

11. The apparatus of claim 1, wherein said means for electrically connecting ones of said traces with ones of said terminals comprise a plurality of bond wires, each said bond wire bonded to one of said traces and to one of said terminals.

12. The apparatus of claim 1, wherein said sockets comprise pits etched into a surface of a corresponding socket substrate.

13. The apparatus of claim 1, wherein said socket substrate comprises silicon.

14. The apparatus of claim 1, wherein the plurality of elongate, spring connection elements have a pitch of less than about 5 mils.

\* \* \* \* \*